United States Patent
Ryu et al.

(10) Patent No.: US 11,524,973 B2
(45) Date of Patent: Dec. 13, 2022

(54) METAL COMPOUNDS AND METHODS OF FABRICATING SEMICONDUCTOR DEVICES USING THE SAME

(71) Applicant: Samsung Electronics Co., Ltd., Suwon-si (KR)

(72) Inventors: Seung-Min Ryu, Hwaseong-si (KR); Akio Saito, Tokyo (JP); Takanori Koide, Tokyo (JP); Atsushi Yamashita, Tokyo (JP); Kazuki Harano, Tokyo (JP); Gyu-Hee Park, Hwaseong-si (KR); Soyoung Lee, Suwon-si (KR); Jaesoon Lim, Seoul (KR); Younjoung Cho, Hwaseong-si (KR)

(73) Assignees: Samsung Electronics Co., Ltd., Suwon-si (KR); Adeka Corporation, Tokyo (JP)

( * ) Notice: Subject to any disclaimer, the term of this patent is extended or adjusted under 35 U.S.C. 154(b) by 269 days.

(21) Appl. No.: 16/857,292

(22) Filed: Apr. 24, 2020

(65) Prior Publication Data
US 2020/0361970 A1   Nov. 19, 2020

(30) Foreign Application Priority Data

May 14, 2019   (KR) .......................... 10-2019-0056596
Nov. 1, 2019   (KR) .......................... 10-2019-0138404

(51) Int. Cl.
*C07F 9/00* (2006.01)
*H01L 21/285* (2006.01)
(Continued)

(52) U.S. Cl.
CPC ........ *C07F 9/005* (2013.01); *H01L 21/28568* (2013.01); *H01L 28/60* (2013.01)

(58) Field of Classification Search
CPC .............. C07F 9/005; H01L 21/28568; H01L 51/0002; H01L 51/0084
See application file for complete search history.

(56) References Cited

U.S. PATENT DOCUMENTS 7,442,407 B2   10/2008   Reuter et al.
8,153,831 B2   4/2012    Thompson et al.
(Continued)

FOREIGN PATENT DOCUMENTS

JP   2004353024   12/2004
JP   2006169617   6/2006
(Continued)

OTHER PUBLICATIONS

Blachnik et al., "Crystal structure of pentachloro(pivalonitrile)niobium(V), NbCl5((CH3)3CCN)," Z. Kristallogr.NCS, 1998, 213. (Year: 1998).*
(Continued)

*Primary Examiner* — Catherine S Branch
(74) *Attorney, Agent, or Firm* — Myers Bigel, P.A.

(57) ABSTRACT

Described herein are metal compounds and methods of fabricating semiconductor devices using the same. The metal compounds include a material of Chemical Formula 1.

[Chemical Formula 1]

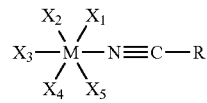

20 Claims, 10 Drawing Sheets

(51) Int. Cl.
*H01L 51/00* (2006.01)
*H01L 49/02* (2006.01)

(56) References Cited

U.S. PATENT DOCUMENTS

| | | |
|---|---|---|
| 8,470,401 B2 | 6/2013 | Merle et al. |
| 8,617,301 B2 | 12/2013 | Wagner |
| 9,040,372 B2 | 5/2015 | Blasco et al. |
| 2008/0107825 A1 | 5/2008 | Ishizaka et al. |
| 2011/0195574 A1 | 8/2011 | Blasco et al. |
| 2017/0152277 A1 | 6/2017 | Lim et al. |
| 2019/0140067 A1 | 5/2019 | Zhu et al. |

FOREIGN PATENT DOCUMENTS

| | | |
|---|---|---|
| JP | 2012505177 | 3/2012 |
| KR | 10-2012-0045408 A | 5/2012 |
| KR | 20170063092 | 6/2017 |

OTHER PUBLICATIONS

Fuggle et al, "Niobium, Tantalum, and Molybdenum Pentafluoride Complexes with Organic Ligands," J. Fluor. Chem., 1 (1971/1972) 427-431. (Year: 1971).*

* cited by examiner

METAL COMPOUNDS AND METHODS OF FABRICATING SEMICONDUCTOR DEVICES USING THE SAME

CROSS-REFERENCE TO RELATED APPLICATIONS

This U.S. nonprovisional application claims priority under 35 U.S.C. § 119 to Korean Patent Application Nos. 10-2019-0056596 filed on May 14, 2019 and 10-2019-0138404 filed on Nov. 1, 2019, in the Korean Intellectual Property Office, the disclosures of which are hereby incorporated by reference in their entirety.

FIELD

The present inventive concepts relate to metal compounds and methods of fabricating a semiconductor device using the same, and more particularly, to deposition processes that use a metal compound of the present invention.

BACKGROUND

In recent years, the development of electronic technology has rapidly accelerated the down-scaling of semiconductor devices. For these reasons, patterns of semiconductor devices have become complicated and fine, which has resulted in more complicated semiconductor fabrication. There is an increasing demand for easily forming thin layers for the fabrication of semiconductor devices.

SUMMARY

Some example embodiments of the present inventive concepts provide a deposition precursor with transport easiness and stability.

Some example embodiments of the present inventive concepts provide a method of forming a thin metal layer, wherein the thin metal layer has a low resistivity.

According to some example embodiments of the present inventive concepts, a metal compound may comprise a material of Chemical Formula 1:

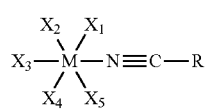

[Chemical Formula 1]

wherein:

M is Nb or Ta;

R is a substituted or unsubstituted C3 to C10 alkyl group; and $X_1$, $X_2$, $X_3$, $X_4$, and $X_5$ are each independently selected from F, Cl, Br, and I.

According to some example embodiments of the present inventive concepts, a method of fabricating a semiconductor device may comprise: providing a deposition precursor; and forming a layer (e.g., a thin layer) using the deposition precursor. In some embodiments, the method comprises preparing the deposition precursor. The deposition precursor may include a metal compound of Chemical Formula 1.

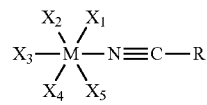

[Chemical Formula 1]

wherein:

M is Nb or Ta;

R is a substituted or unsubstituted C3 to C10 alkyl group; and $X_1$, $X_2$, $X_3$, $X_4$, and $X_5$ are each independently selected from F, Cl, Br, and I.

DETAILED DESCRIPTION OF EMBODIMENTS

Figure 1:
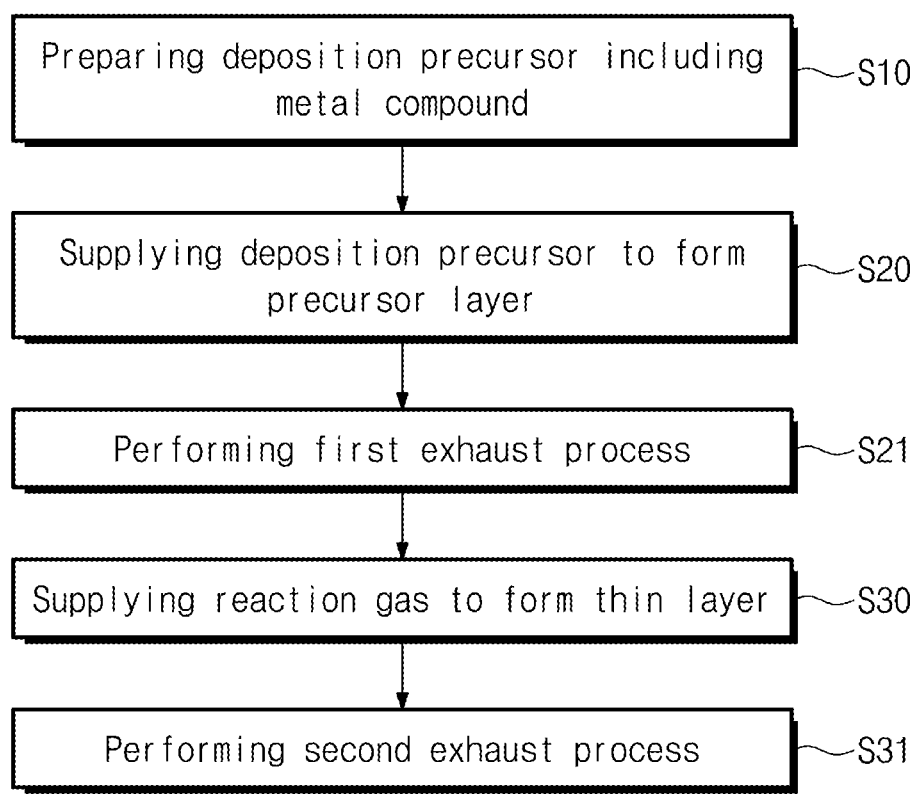
FIG. 1 illustrates a flow chart for a deposition process that uses a metal compound according to some example embodiments.

As used herein in this description, the language "unsubstituted or substituted" may mean unsubstituted or substituted with at least one substituent selected from a deuterium atom, halogen atom, cycloalkyl, aryl, heteroaryl, heteroalicyclic, hydroxy, alkoxy, aryloxy, alkylthio, arylthio, cyano, halogen, carbonyl, amino, and any derivative thereof. In addition, each substituent may be substituted or unsubstituted. For example, a halogen alkyl group may be interpreted as an alkyl group that is substituted with a halogen.

As used herein in this description, an alkyl group may be a linear, branched, or cyclic alkyl group. The number of carbon atoms in an alkyl group may be 1 to 10 (also referred to herein as a C1 to C10 alkyl), but the present inventive concepts are not limited thereto. For example, an alkyl group may include three or ten carbon atoms (also referred to herein as a C3 to C10 alkyl).

As used herein in this description, a halogen element may include fluorine (F), chlorine (Cl), bromine (Br), and iodine (I).

Unless defined otherwise in this description, when no chemical bond is drawn at a position in a chemical formulae for which a bond may be present, a hydrogen may be bonded to the position. In this description, room temperature may be a temperature of 25° C.

As used herein in this description, like reference numerals may indicate like components.

The following will now describe a metal compound and a method of fabricating the same according to the present inventive concepts. In some embodiments, a metal compound of the present inventive concepts is a coordination compound (e.g., a transition metal nitrile complex).

According to the present inventive concepts, a metal compound may be represented by Chemical Formula 1 below.

[Chemical Formula 1]

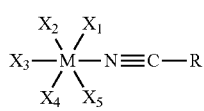

In Chemical Formula 1, M may be Nb or Ta, R may be an unsubstituted or substituted C3 to C10 alkyl group, and $X_1$, $X_2$, $X_3$, $X_4$, and $X_5$ may each independently be one selected from F, Cl, Br, and I.

In some embodiments, when R is a halogen-substituted alkyl group in Chemical Formula 1, the halogen of the halogen-substituted alkyl group may be F, Cl, Br, or I. For example, the halogen-substituted alkyl group may be a fluorine-substituted alkyl group or a chlorine-substituted alkyl group.

In some embodiments, $X_1$, $X_2$, $X_3$, $X_4$, and $X_5$ may each independently be one selected from F and Cl.

The metal compound represented by Chemical Formula 1 may be one selected from a compound of group A.

[Compounds of group A]

No.1
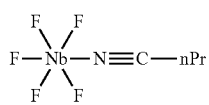

No.2
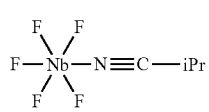

No.3
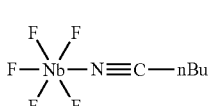

No.4
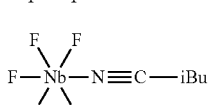

No.5
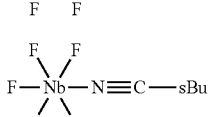

No.6
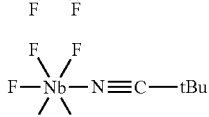

No.7
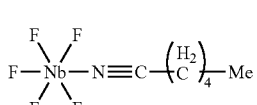

No.8
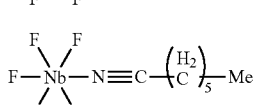

No.9
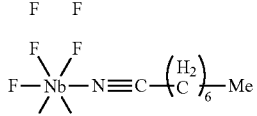

No.10
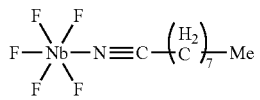

No.11
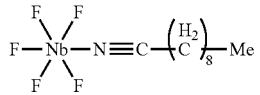

No.12
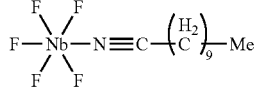

No.13
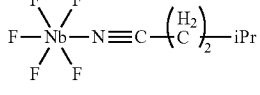

No.14
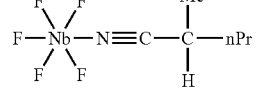

No.15
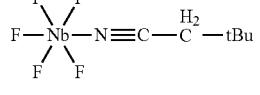

No.16
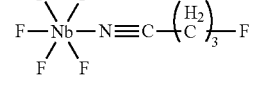

No.17
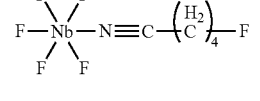

No.18
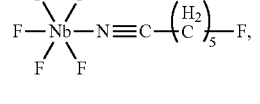

No.19
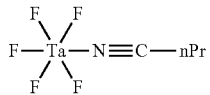

No.20
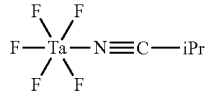

No.21
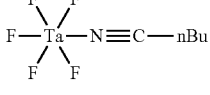

No.22
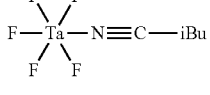

No.23
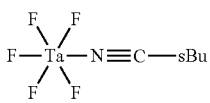

No.24: F₄Ta—N≡C—tBu (TaF₄ with axial F, nitrile tBu)

No.25: F₅Ta—N≡C—(CH₂)₄—Me

No.26: F₅Ta—N≡C—(CH₂)₅—Me

No.27: F₅Ta—N≡C—(CH₂)₆—Me

No.28: F₅Ta—N≡C—(CH₂)₇—Me

No.29: F₅Ta—N≡C—(CH₂)₈—Me

No.30: F₅Ta—N≡C—(CH₂)₉—Me

No.31: F₅Ta—N≡C—(CH₂)₂—iPr

No.32: F₅Ta—N≡C—C(Me)(H)—nPr

No.33: F₅Ta—N≡C—CH₂—tBu

No.34: F₅Ta—N≡C—(CH₂)₃—F

No.35: F₅Ta—N≡C—(CH₂)₄—F

No.36: F₅Ta—N≡C—(CH₂)₅—F

No.37: Cl₅Nb—N≡C—nPr

No.38: Cl₅Nb—N≡C—iPr

No.39: Cl₅Nb—N≡C—nBu

No.40: Cl₅Nb—N≡C—iBu

No.41: Cl₅Nb—N≡C—sBu

No.42: Cl₅Nb—N≡C—tBu

No.43: Cl₅Nb—N≡C—(CH₂)₄—Me

No.44: Cl₅Nb—N≡C—(CH₂)₅—Me

No.45: Cl₅Nb—N≡C—(CH₂)₆—Me

No.46: Cl₅Nb—N≡C—(CH₂)₇—Me

No.47: Cl₅Nb—N≡C—(CH₂)₈—Me

No.48: Cl₅Nb—N≡C—(CH₂)₉—Me

No.49: Cl₅Nb—N≡C—(CH₂)₂—iPr

No.50: Cl₅Nb—N≡C—C(Me)(H)—nPr

No.51: Cl₅Nb—N≡C—CH₂—tBu

No.52 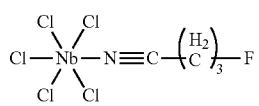
No.53 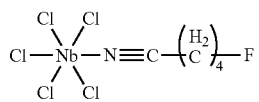
No.54 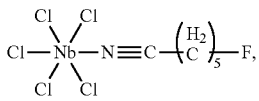
No.55 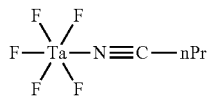
No.56 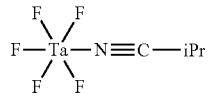
No.57 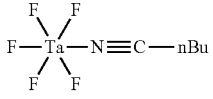
No.58 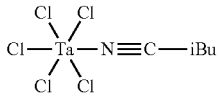
No.59 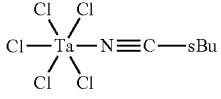
No.60 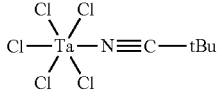
No.61 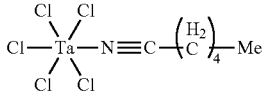
No.62 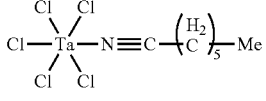
No.63 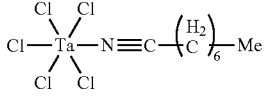
No.64 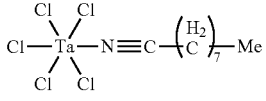
No.65 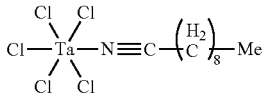
No.66 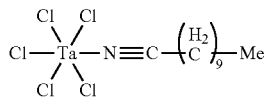
No.67 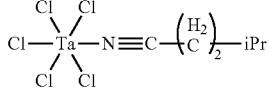
No.68 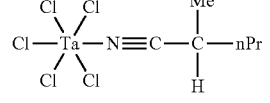
No.69 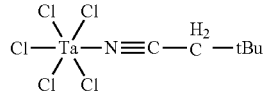
No.70 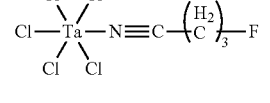
No.71 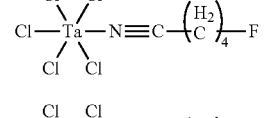
No.72 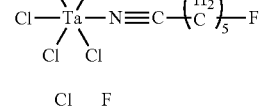
No.73 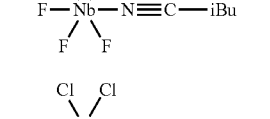
No.74 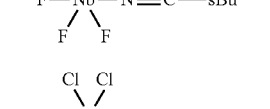
No.75 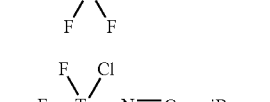
No.76 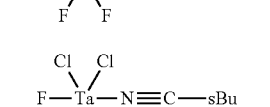
No.77 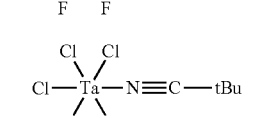
No.78 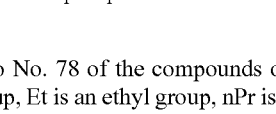
In No. 1 to No. 78 of the compounds of group A, Me is a methyl group, Et is an ethyl group, nPr is a n-propyl group, iPr is an isopropyl group, iBu is an isobutyl group, sBu is a sec-butyl group, and tBu is a tert-butyl group.
The nPr may be represented by Chemical Formula 2A below.

[Chemical Formula 2A]

The iPr may be represented by Chemical Formula 2B below.

[Chemical Formula 2B]

The iBu may be represented by Chemical Formula 2C below.

[Chemical Formula 2C]

The sBu may be represented by Chemical Formula 2D below.

[Chemical Formula 2D]

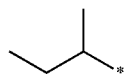

The tBu may be represented by Chemical Formula 2E below.

[Chemical Formula 2E]

In Chemical Formulae 2A to 2E, the * symbol may mean a point of attachment to C of a nitrile group contained in one of No. 1 to No. 78 of the compounds of group A.

The metal compound may be used as a deposition precursor. For example, the metal compound may be used as a deposition precursor for atomic layer deposition (ALD) or chemical vapor deposition (CVD). The metal compound may be used as a deposition precursor to form a metal-containing thin layer. An increase in stability of a deposition precursor may improve one or more characteristic(s) of a deposited layer.

In some embodiments, the metal compound may include a metal (M) and a nitrile group (CN). Because the metal compound includes the nitrile group, the metal compound may have a low melting point. For example, the melting point of the metal compound may be in a range from −50° C. to 60° C. The metal compound may be in a liquid state at room temperature (e.g., 25° C.). Alternatively, the metal compound may be in a solid state at room temperature, but low energy may be required to provide and/or keep the metal compound in a liquid state at room temperature. Therefore, it may be possible to easily transport the metal compound in a liquid state. In this case, because the metal compound according to some embodiments is used as a deposition precursor, a central supply system may be employed to supply the deposition precursor. The central supply system may indicate that a deposition precursor is supplied through a precursor storage unit 30 which will be discussed below with reference to FIG. 2.

When an alkyl group is directly bonded to a metal of a deposition precursor, the deposition precursor may be unstable. For example, the metal deposition precursor may be decomposed prior to introduction into a deposition chamber.

In some embodiments, the metal compound may include a nitrile group (CN). The nitrogen of the nitrile group may be directly bonded to the metal (M). An alkyl group (R) may not be directly bonded to the metal (M), but may be bonded to carbon of the nitrile group. Therefore, a metal compound of the present inventive concepts may have increased stability such as, e.g., compared to the stability of a metal compound that has a carbon directly bonded to a metal. For example, the metal compound may not be decomposed during transport and/or in the procedure of supplying a chamber with the metal compound.

During deposition, the nitrile group may be separated from the metal (M). In this case, the alkyl group (R) together with the nitrile group may be separated from the metal. Therefore, a deposited layer may include the metal, but may not include an element originating from the nitrile group and/or the alkyl group. The element originating from the nitrile group or the alkyl group may include, for example, one or more of carbon, nitrogen, and halogen elements. When the element originating from the nitrile group or the alkyl group remains on the deposited layer, the element may serve as an impurity. When the metal compound according to some embodiments is used as a deposition precursor to form a thin layer, the thin layer may have a low amount of impurities. For example, the thin layer may include a metal, but not carbon. Accordingly, the thin layer may have low resistivity and/or increased electrical characteristics.

When the metal compound is used as a deposition precursor, a deposition process may have a relatively wide deposition window. The deposition window may denote a temperature range at which a deposition process is performed when a certain deposition precursor is used. The deposition window may include an atomic layer deposition (ALD) window. Therefore, according to some embodiments of the present invention, it may be possible to reduce constraints on deposition process conditions.

The metal compound may include no impurities or include a low-concentration of impurities. The impurities may indicate a different material than that of Chemical Formula 1. The impurities may include one or more of metal-containing impurities, halogen-containing impurities, and/or organic impurities. In some embodiments, a metal compound of the present inventive concepts may have a concentration of metal impurities of less than 1 ppm. The metal compound may have a concentration of metal impurities in range from 0 ppb to 100 ppm, for example, from 1 ppb to 100 ppb. As used herein in this description, the phrase "a concentration of certain impurities is zero" may mean that no impurities are included. When the metal compound includes metal impurities that include a plurality of different metal elements, each of the metal elements may have a concentration of 100 ppb or less, for example, 10 ppb or less. The metal impurities may include one or more of alkaline metals and/or alkaline-earth metals. The halogen-containing impurities may include one or more of fluorine, chlorine, bromine, and iodine. A concentration of halogen-containing impurities in the metal compound may be 100 ppm or less. For example, the metal compound may have a concentration of halogen-containing impurities in an amount of of 10 ppm or less, for example, 1 ppm or less. A concentration of organic impurities in the metal compound may be 500 ppm or less. For example, the metal compound may have a concentration of organic impurities in an amount of 50 ppm or less, for example, 10 ppm or less. The metal compound may include no moisture or include low-concentration moisture. A concentration of moisture contained in the metal compound may be 10 ppm or less, for example, 1 ppm or less. As used herein in this description, the phrase "a concentration of moisture contained in a certain material is 10 ppm or less" may mean that the concentration of moisture is in a range from 0 to 10 ppm.

When the metal compound is in a liquid or solid state, the impurities may be present in the form of particles. The amount of the impurity particles present in the metal compound may be low. The impurity particles may have a small diameter. When the diameter of the impurity particles is larger than 0.3 μm, 1 mL of the metal compound may contain 100 or less (e.g., 0 to 100) impurity particles having a diameter larger than 0.3 μm. When the diameter of the impurity particles is larger than 0.2 μm, 1 mL of the metal compound may contain 100 or less (e.g., 0 to 100) the impurity particles having a diameter larger than 0.2 μm.

When a deposition precursor includes impurities, contaminated particles may be formed in and/or on a deposited thin layer. In some embodiments, the metal compound may include no impurities or an extremely low-concentration impurities. Accordingly, a deposited thin layer may exhibit superior characteristics.

The metal compound according to some embodiments may have a high vapor pressure and thus may be easily evaporated. When using a deposition precursor including a metal compound of the present inventive concepts, a deposition process may be easily performed.

The following will discuss an exemplary fabrication of the metal compound.

A halogenated metal and alkane nitrile may be added to a solvent, which may result in a mixture. The solvent may be an organic solvent, for example, hexane. The halogenated metal may include a metal and halogen elements bonded to the metal. The metal may be defined by M in Chemical Formula 1, and may include one selected from Nb and Ta. The halogen elements may be one selected from F, Cl, Br, and I. For example, the halogenated metal may include $NbF_5$ or $TaF_5$. The alkane nitrile may be a C3 to C10 alkane nitrile. Afterwards, a reaction of the mixture may be performed. The reaction may be executed, for example, at a temperature of about 50° C. Thereafter, the solvent and remaining reactants may be removed such that a reactant may be separated. The reactant may experience distillation and/or purification to fabricate the metal compound. The metal compound may be fabricated according to various methods, without being limited thereto.

The following will discuss a deposition process using a metal compound of the present inventive concepts and a method of forming a thin layer according to some embodiments of the present inventive concepts.

Figure 2:
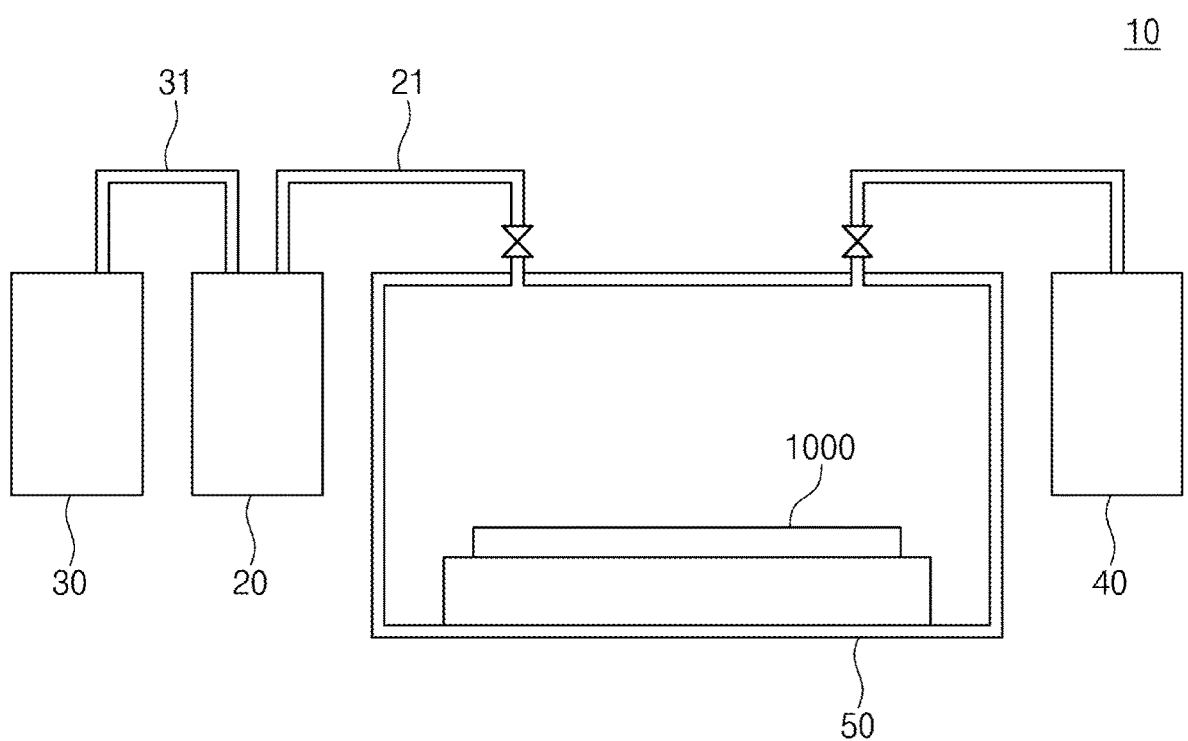
FIG. 2 illustrates a schematic diagram showing a deposition system according to some example embodiments.

FIG. 1 illustrates a flow chart showing a deposition process that uses a metal compound according to some example embodiments. FIG. 2 illustrates a schematic diagram showing a deposition system according to some example embodiments.

Referring to FIG. 1, a deposition process may include preparing a deposition precursor including a metal compound (S10), supplying the deposition precursor to form a precursor layer (S20), and supplying a reaction gas to form a thin layer (S30). The deposition process may further include performing a first exhaust process (S21) and/or a performing a second exhaust process (S31). The deposition process may be an atomic layer deposition process.

Referring to FIGS. 1 and 2, a deposition system 10 may include a chamber 50, a precursor supply unit 20, a precursor storage unit 30, and a reaction gas supply unit 40. The deposition system 10 may be utilized in an atomic layer deposition process. Alternatively, the deposition system 10 may be used in a chemical vapor deposition process. A substrate 1000 may be loaded into the chamber 50. The substrate 1000 may be a wafer substrate, such as a semiconductor wafer.

A reaction gas may be present or provided in the reaction gas supply unit 40. The reaction gas may include one or more of an oxidizing gas, a reducing gas, and/or a nitrogen-containing gas. The reaction gas supply unit 40 may provide the chamber 50 with the reaction gas.

The precursor storage unit 30 may include, for example, a storage tank. The tank may include or be provided with the deposition precursor in a liquid state. A first supply pipe 31 may connect the precursor storage unit 30 to the precursor supply unit 20. Therefore, it may be possible to omit a step of providing a separate tank into the precursor supply unit 20 and a step of replacing the precursor storage tank 30. The precursor storage unit 30 may be used to supply the deposition precursor. The deposition system 10 may be a central supply system.

The deposition precursor may be prepared which includes the metal compound (S10). The deposition precursor may be provided into the precursor storage unit 30. The deposition precursor in the precursor storage unit 30 may be transferred through the first supply pipe 31 to the precursor supply unit 20. When a deposition precursor is in a solid state, the deposition precursor may have difficulty flowing through the first supply pipe 31. As discussed above, because the metal compound according to some embodiments has a low melting point, the metal compound may have a liquid state at room temperature. Alternatively, the metal compound may have a solid state at room temperature, but low energy may be required to convert the metal compound into a liquid state at room temperature. Because the deposition precursor includes the metal compound according to some embodiments, the deposition precursor may easily be transferred through the first supply pipe 31.

In another example, the metal compound may be dissolved in an organic solvent, and thus a precursor solution may be fabricated. The organic solvent may include one or more of an acetic ester solvent, an ether solvent, a ketone solvent, a hydrocarbon solvent, and/or a heteroaromatic solvent. A concentration of moisture in the organic solvent may be 10 ppm or less, for example, 1 ppm or less. The acetic ester solvent may include one or more of ethyl acetate, butyl acetate, and methoxyethyl acetate. The ether solvent may include one or more of tetrahydrofuran, tetrahydropyrane, ethylene glycoldimethylether, diethylene glycoldimethylether, triethylene glycoldimethylether, dibutylether, and dioxane. The ketone-based solvent may include, for example, methylbutylketone. The hydrocarbon solvent may include a cyano. The hydrocarbon solvent including a cyano may include one or more of 1,3-dicyanopropane, 1,4-dicyanobutane, 1,6-dicyanohexane, 1,4-dicyanocyclohexane, and 1,4-dicyanobenzene. The heteroaromatic solvent may include one or more of pyridine and lutidine.

When the deposition precursor is provided in the form of a precursor solution, the deposition precursor may have a molarity of 0.01 mol/L to 2.0 mol/L, for example, 0.05 ml/L to 1.0 mol/L.

The deposition precursor may further include an additional precursor in addition to the metal compound. The metal compound and the additional precursor may be mixed with each other to fabricate a mixed precursor. For example, in some embodiments, the deposition precursor may be a mixed precursor. The mixed precursor may be provided into the chamber 50. In some embodiments, independently of the metal compound, the additional precursor may be provided through a separate supply path to the chamber 50. The additional precursor may have stability. For example, the additional precursor may not react with the metal compound or may have extremely low reactivity with the metal compound. There may, thus, be no occurrence of decomposition and/or oxidation of the additional precursor, decomposition and/or oxidation of the metal compound, and/or reaction between the additional precursor and the metal compound. A concentration of moisture in the additional precursor may be 10 ppm or less, for example, 1 ppm or less.

The additional precursor may include one or more of a semiconductor compound, a metal compound, and/or an organic compound. The semiconductor compound may include one or more of silicon and germanium. The metal compound may include one or more of lithium, sodium, potassium, magnesium, calcium, strontium, barium, titanium, zirconium, hafnium, vanadium, chromium, molybdenum, tungsten, manganese, iron, cobalt, rhodium, iridium, nickel, palladium, platinum, silver, copper, gold, zinc, aluminum, gallium, indium, tin, lead, antimony, bismuth, yttrium, lanthanum, cerium, praseodymium, neodymium, promethium, samarium, europium, gadolinium, terbium, dysprosium, holmium, erbium, thulium, ytterbium, and ruthenium.

The organic compound may include one or more of an alcohol compound, a glycol compound, a β-diketone compound, a cyclopentadiene compound, and/or an amine compound. The organic compound may serve to provide an organic ligand. For example, the deposited thin layer may include a ligand originating from the organic compound.

The alcohol compound may include, for example, one or more of an alkyl alcohol compound, an ether alcohol compound, and/or a dialkyl amino alkyl alcohol compound. The alkyl alcohol compound may be an alcohol compound including an alkyl group. For example, the alkyl alcohol compound may include one or more of ethanol, propanol, isopropyl alcohol, butanol, secondary butyl alcohol, isobutyl alcohol, tertiary butyl alcohol, pentyl alcohol, isopentyl alcohol, and tertiary pentyl alcohol. The ether alcohol compound may be an alcohol compound including an ether group. For example, the ether alcohol compound may include one or more of 2-methoxy ethanol, 2-ethoxy ethanol, 2-butoxyethanol, 2-(2-methoxy ethoxide)ethanol, 2-methoxy-1-methyl ethanol, 2-methoxy-1,1-dimethyl ethanol, 2-ethoxide-1,1-dimethyl ethanol, 2-isopropoxy-1,1-dimethyl ethanol, 2-butoxy-1,1-dimethyl ethanol, 2-(2-methoxy ethoxide)-1,1-dimethyl ethanol, 2-propoxy 1,1-diethyl ethanol, 2-s-butoxy-1,1-diethyl ethanol, and 3-methoxy-1,1-dimethyl propanol. The dialkyl amino alkyl alcohol compound may include, for example, one or more of dimethyl amimo ethanol, ethyl methyl amimo ethanol, diethyl amimo ethanol, dimethyl amimo-2-pentanol, ethyl methyl amimo-2-pentanol, dimethyl amimo-2-methyl-2-pentanol, ethyl methyl amimo-2-methyl-2-pentanol, and diethyl amimo-2-methyl-2-pentanol.

The glycol compound may include, for example, one or more of 1,2-ethanediol, 1,2-propane diol, 1,3-Propane diol, 2,4-Hexane diol, 2,2-dimethyl-1,3-propane diol, 2,2-diethyl-1,3-propane diol, 1,3-butanediol, 2,4-butanediol, 2,2-diethyl-1,3-butanediol, 2-ethyl-2-butyl-1,3-propane diol, 2,4-pentane diol, 2-methyl-1,3-propane diol, 2-methyl-2,4-pentane diol, 2,4-hexane diol, and 2,4-dimethyl-2,4-pentane diol.

The β-diketone compound may include one or more of an alkyl-substituted β-diketone compound, a fluorine-substituted β-diketone compound, and an ester-substituted β-diketone compound. The alkyl-substituted β-diketone compound may include one or more of acetyl acetone, hexane-2,4-dione, 5-methyl hexane-2,4-dione, heptane-2,4-dione, 2-methyl heptane-3,5-dione, 5-methyl heptane-2,4-dione, 6-methyl heptane-2,4-dione, 2,2-dimethyl heptane-3,5-dione, 2,6-dimethyl heptane-3,5-dione, 2,2,6-trimethylheptane-3,5-dione, 2,2,6,6-tetramethylheptane-3,5-dione, octane-2,4-dione, 2,2,6-trimethyl octane-3,5-dione, 2,6-dimethyl octane-3,5-dione, 2,9-dimethylnonane-4,6-dione, 2-methyl-6-ethyl decane-3,5-dione, and 2,2-dimethyl-6-ethyl decane-3,5-dione. The fluorine-substituted β-diketone compound may include one or more of 1,1,1-trifluoro pentane-2,4-dione, 1,1,1-trifluoro-5,5-dimethyl hexane-2,4-dione, 1,1,1,5,5,5-hexafluoro pentane-2,4-dione, and 1,3-diper-fluorohexylpropane-1,3-dione. The ester-substituted β-diketone compound may include one or more of 1,1,5,5-tetra methyl-1-methoxy hexane-2,4-dione, 2,2,6,6-tetra methyl-1-methoxy heptane-3,5-dione, and 2,2,6,6-tetra methyl-1-(2-methoxy ethoxide)heptane-3,5-dione.

The cyclopentadiene compound may include one or more of cyclopentadiene, methyl cyclopentadiene, ethyl cyclopentadiene, propyl cyclopentadiene, isopropyl cyclopentadiene, butyl cyclopentadiene secondary butyl cyclopentadiene, isobutyl cyclopentadiene tertiary butyl cyclopentadiene, dimethyl cyclopentadiene, and tetra methyl cyclopentadiene.

The amine compound may include one or more of methylamine, ethylamine, propyl amine, isopropyl amine, butyl amine, secondary butyl amine, tertiary butyl amine, isobutyl amine, dimethyl amine, diethyl amine, dipropyl amine, isopropyl amine, ethyl methylamine, propyl methylamine, and isopropyl methylamine.

The deposition precursor may further include a nucleophilic reagent. The nucleophilic reagent may increase stability of the deposition precursor. For example, the nucleophilic reagent may increase stability of a metal compound of the present inventive concepts and/or the additional precursor. The nucleophilic reagent may be present in 1 mol of the deposition precursor in an amount in a range from 0.1 mol to 10 mol, for example, from 1 mol to 4 mol. A concentration of moisture in the nucleophilic reagent may be 10 ppm or less, for example, 1 ppm or less.

The nucleophilic reagent may include one or more of an ethylene glycol ether reagent, a crown ether reagent, a polyamine reagent, a heterocyclic reagent, a β-keto ester reagent, and a β-diketone reagent. The ethylene glycol ether reagent may include, for example, one or more of glyme, diglyme, triglyme, and tetraglyme. The crown ether reagent may include one or more of 18-crown-6, dicyclohexyl-18-crown-6, 24-crown-8, dicyclohexyl-24-crown-8, and dibenzo-24-crown-8.

The polyamine reagent may include a plurality of amino groups. For example, the polyamine reagent may include one or more of ethylene diamine, N,N'-tetra methyl ethylene diamine diethylene triamine, triethylenetetraamine, tetraethylenepentamine, penta ethylene hexamine, 1,1,4,7,7-penta methyl diethylene tri amine, 1,1,4,7,10,10-hexamethyl tri ethylene tetramine, and triethoxytriethyleneamine. The polyamine reagent may include a ring type polyamine reagent. The ring type polyamine reagent may include, for example, one or more of cyclam and cyclen.

The heterocyclic reagent may include one or more of pyridine, pyrrolidine, piperidine, morpholine, N-methyl pyrrolidine, N-methyl piperidine, N-methyl morpholine, tetra hydro furane, tetrahydropyran, 1,4-dioxane, oxazole, thiazole, and oxathiorane.

The β-keto ester reagent may include, for example, one or more of acetoacetic acid ester, methyl acetoacetic acid ester, acetoacetic acid ethyl ester, and acetoacetic acid-2-methoxy ethyl ester.

The β-diketone reagent may include, for example, one or more of acetylacetone, 2,4-hexanedione 2,4-heptanedione, 3,5-heptanedione, and dipyvaloylmethane.

A second supply pipe 21 may connect the precursor supply unit 20 to the chamber 50. The metal compound according to some embodiments may have a high vapor pressure and high volatility, and thus a gaseous deposition precursor may easily be formed. The gaseous deposition precursor may be effortlessly provided from the precursor supply unit 20 through the second supply pipe 21 into the chamber 50.

In some embodiments, a gas transport method may be employed to supply the chamber 50 with the deposition precursor. For example, a liquid deposition precursor may be heated and/or decompressed in the precursor supply unit 20, which may result in evaporation of the deposition precursor. In another embodiment, a liquid transport method may be employed to supply the chamber 50 with the deposition precursor. For example, an evaporation chamber (not shown) may be separately provided between the precursor supply unit 20 and the chamber 50. In this case, the second supply pipe 21 may connect the evaporation chamber to the chamber 50. The evaporation chamber may be supplied with the deposition precursor in a liquid state. The deposition precursor may be heated and/or decompressed in the evaporation chamber, which may result in evaporation of the deposition precursor. Therefore, the gaseous deposition precursor may be formed. The chamber 50 may be supplied with the gaseous deposition precursor alone or together with a carrier gas. The carrier gas may include an inert gas such as argon, nitrogen, and/or helium.

The deposition precursor may be evaporated at a temperature of about 0° C. to about 150° C. Evaporation of the deposition precursor may be performed at a pressure of about 1 Pa to about 10,000 Pa. The following will discuss in detail a thin-layer formation that uses a metal compound according to some embodiments of the present inventive concepts as the deposition precursor with reference to FIGS. 3A to 3B.

Figure 3A:
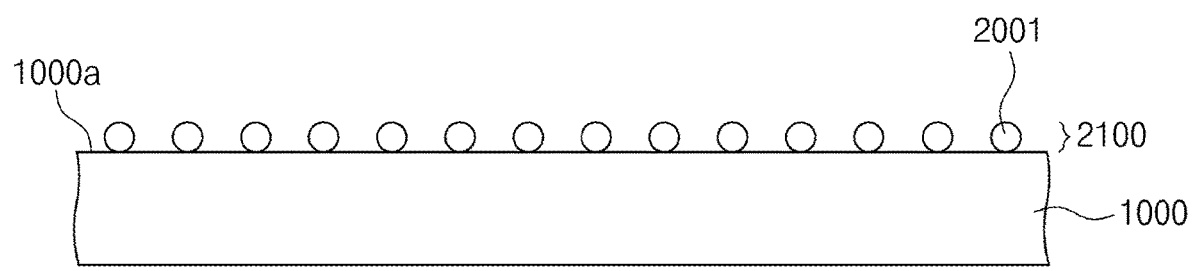
FIGS. 3A and 3B illustrate cross-sectional views showing a method of forming a thin layer according to some example embodiments.
Figure 3B:
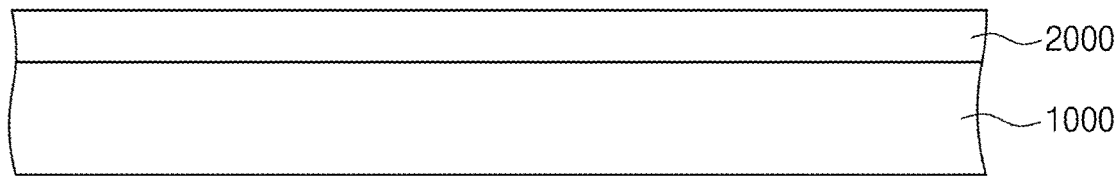

FIGS. 3A and 3B illustrate cross-sectional views showing a method of forming a thin layer according to some example embodiments.

Referring to FIGS. 1, 2, and 3A, the chamber 50 may be provided with a deposition precursor 2001 to form a precursor layer 2100 on the substrate 1000 (S20). The chamber 50 may receive the deposition precursor 2001 in a gaseous state. The deposition precursor 2001 may include a metal compound as described herein.

The substrate 1000 may include, for example, a semiconductor material. For example, the substrate 1000 may include one or more of silicon, germanium, silicon nitride, titanium nitride, tantalum nitride, titanium oxide, niobium oxide, zirconium oxide, hafnium oxide, and lanthanum oxide. The substrate 1000 may have one or more of a plate shape, a spherical shape, a fiber shape, and a scaled shape. Although not shown, a trench may be provided and/or formed on the substrate 1000.

During the step S20 of supplying the deposition precursor 2001, the substrate 1000 may be maintained in and/or exposed to a temperature of 150° C. to 400° C., for example, 200° C. to 300° C. At step S20 of supplying the deposition precursor 2001, the chamber 50 may have a pressure of 1 Pa to 10,000 Pa, for example, 10 Pa to 1,000 Pa. During the step S20 of supplying the deposition precursor 2001, light and/or heat may be applied to the chamber 50. In this case, the pressure of the chamber 50 may range from 10 Pa to 1,013 Pa. During the step S20 of supplying the deposition precursor 2001 into the chamber 50, a plasma may be applied to the chamber 50. In this case, the pressure of the chamber 50 may range from 10 Pa to 2,000 Pa.

The deposition precursor 2001 may be adsorbed on a top surface 1000a of the substrate 1000, thereby forming the precursor layer 2100. When a metal compound of Chemical Formula 1 is used as the deposition precursor 2001, the nitrile group of the metal compound may be separated from the metal (M) during and/or prior to the adsorption of the deposition precursor 2001. In this case, the alkyl group (R) together with the nitrile group may be separated from the metal. Thereafter, one or more halogen element(s) contained in the metal compound may be further separated from the metal (M). The halogen elements may be groups as defined by $X_1$, $X_2$, $X_3$, $X_4$, and $X_5$ in Chemical Formula 1. Therefore, after completion of the formation of the precursor layer 2100, the precursor layer 2100 may not include the nitrile group, the alkyl group, and/or elements originating from the nitrile group and/or the alkyl group. For example, the precursor layer 2100 may include a metal, but not carbon and/or halogen elements.

In some embodiments, after the step S20 of forming the precursor layer 2100, a first exhaust process may be performed (S21). During the first exhaust process, deposition precursor 2001 (e.g., deposition precursor remaining in chamber 50 that is not absorbed on a top surface 1000a of the substrate 1000) and a byproduct gas may be removed from the chamber 50. The first exhaust process may include a purge process, a decompression process, or a combination thereof. The purge process may be performed in such a way that the chamber 50 is supplied with an inert gas. The inert gas may include one or more of argon, nitrogen, and helium. The decompression process may include reducing a pressure of the chamber 50. The decompression process may continue until the pressure of the chamber 50 approaches 0.01 Pa to 300 Pa, for example, 0.01 Pa to 100 Pa.

As shown in FIGS. 1, 2, and 3B, the chamber 50 may be supplied with a reaction gas to form a thin layer 2000 (S30). The reaction gas may react with the precursor layer 2100. For example, the reaction gas may react with the deposition precursor 2001 adsorbed on the substrate 1000. Therefore, a thin layer 2000 may be formed on the substrate 1000. In some embodiments, the thin layer may have a thickness of about 1, 2, 3, 4, 5, 6, 7, 8, 9, 10 nm or more.

The reaction gas may include one or more of an oxidizing gas, a reducing gas, and/or a nitrogen-containing gas. The oxidizing gas may include, for example, one or more of oxygen, ozone, nitrogen dioxide, nitrogen monoxide, water vapor, hydrogen peroxide, acetic acid, and acetic anhydride. The reducing gas may include hydrogen. The nitrogen-containing gas may include one or more of ammonia, hydrazine, methyl hydrazine, mono(alkyl)amine, dialkylamine, trialkylamine, triamine, alkylene, and diamine. In some embodiments, the reaction gas may include $NO_2$ (nitrogen dioxide), $N_2O$ (nitrous oxide), alcohol, NOx, COx, SOx, $CO_2$, $H_2O_2$, HCOOH, $CH_3COOH$, and/or $(CH_3CO)_2O$, where, x is a positive real number. The reaction gas may be a mixed gas including two or more different gases. In some embodiments, the mixed gas may include ammonia.

When a nitrogen-containing gas is used as the reaction gas, the deposited thin layer 2000 may include a metal nitride layer or a metal-containing composite nitride layer. When an oxidizing gas is used as the reaction gas, the deposited thin layer 2000 may include oxygen. For example, the deposited thin layer 2000 may include a metal oxide layer or a metal-containing composite oxide layer.

During the step S30 of supplying the reaction gas to form the thin layer 2000, the substrate 1000 may be maintained in and/or exposed to a temperature of 25° C. to 400° C., for example, 200° C. to 350° C. During the step S30 of supplying the reaction gas to form the thin layer 2000, the chamber 50 may have a pressure of 1 Pa to 10,000 Pa, for example, 10 Pa to 1,000 Pa. During step S30 of supplying the reaction gas to form the thin layer 2000, light and/or heat may be applied to the chamber 50. In some embodiments, the pressure of the chamber 50 may range from 10 Pa to 1,013 Pa. During step S30 of supplying the reaction gas to form the thin layer 2000, a plasma may be applied to the chamber 50. In this case, the pressure of the chamber 50 may range from 10 Pa to 2,000 Pa.

A metal compound according to some embodiments of the present inventive concepts may have a high reactivity with a nitrogen-containing gas. When the precursor layer 2100 is formed using the metal compound according to some embodiments, the precursor layer 2100 may have a high reactivity with the nitrogen-containing gas. Therefore, it may be possible to easily form a metal nitride layer or a metal-containing composite nitride layer. The thin layer 2000 may exhibit increased characteristics and/or have a low amount of impurities.

In the deposition process, the chamber 50 may be additionally supplied with energy. The energy may include one or more of plasma, light, heat, and voltage. For example, the deposition process may be accomplished by performing atomic layer deposition. The supply of energy may be performed in one or more of the step S20 of supplying the deposition precursor 2001, the step S21 of performing the first exhaust process, the step S30 of supplying the reaction gas, and the step S31 of performing the second exhaust process. In some embodiments, the deposition process may be accomplished by performing one of thermal chemical vapor deposition (CVD), plasma CVD, photo CVD, and photo-plasma CVD.

According to some embodiments, a material of the thin layer 2000 may be determined by the metal compound, the kind of reaction gas, and the kind of additional precursor. The thin layer 2000 may include a metal-containing layer. The metal-containing layer may include a niobium-containing layer or a tantalum-containing layer. The niobium-containing layer may include, for example, one or more of a niobium layer, a niobium alloy layer, a niobium nitride layer, a niobium oxide layer, and/or a niobium composite oxide layer. The niobium composite oxide layer may include one or more of a niobium oxynitride layer, a niobium metal oxide layer, and/or a niobium carboxide layer. The niobium alloy layer may include niobium and a metal different than niobium. For example, the niobium alloy layer may include an alloy of Nb—Hf or Nb—Ti. The niobium metal oxide layer may be an oxide layer of niobium and a metal alloy. The tantalum-containing layer may include, for example, one or more of a tantalum layer, a tantalum alloy layer, a tantalum nitride layer, a tantalum oxide layer, and a tantalum composite oxide layer. The tantalum composite oxide layer may include one or more of a tantalum oxynitride layer, a tantalum metal oxide layer, and a tantalum carboxide layer. The tantalum alloy layer may include tantalum and metal different from tantalum. The tantalum alloy layer may include, for example, an alloy of Ta—Ti or Ta—W. The niobium- or tantalum-containing layer according to some embodiments may have increased electrical and optical characteristics.

A deposition rate of the precursor layer 2100 may be adjusted by a supply condition of the deposition precursor 2001, a temperature of the substrate 1000, and/or a pressure of the chamber 50. The supply condition of the deposition precursor 2001 may include an evaporation temperature of the deposition precursor 2001 and/or a pressure of the evaporated deposition precursor 2001. When the precursor layer 2100 is deposited at an extremely low rate (e.g., less than 0.01 nm/min), the thin layer 2000 may have low productivity. When the precursor layer 2100 is deposited at an extremely high rate (e.g., greater than 100 nm/min), the thin layer 2000 may have poor characteristics. According to some embodiments, the precursor layer 2100 may be deposited at a rate of 0.05 nm/min to 100 nm/min, for example, 1 nm/min to 50 nm/min. As a result, the thin layer 2000 may exhibit excellent characteristics and/or have increased productivity.

After the formation of the thin layer 2000, an annealing process may further be performed on the thin layer 2000. The annealing process may be executed in an inert gas environment, an oxidizing gas environment, or a reducing gas environment. The annealing process may increase electrical characteristics of the thin layer 2000. In this, the electrical characteristics may include dielectric properties.

After the formation of the thin layer 2000, a reflow process may further be performed on the thin layer 2000. The reflow process may improve step coverage of the thin layer 2000. The reflow process may be executed at a temperature, for example, of 200° C. to 1000° C., for example, 250° C. to 500° C.

After the thin layer 2000 is formed, the second exhaust process may be performed (S31). During the second exhaust process, a remaining reaction gas and/or a byproduct gas may be removed from the chamber 50. Similar to the first exhaust process, the second exhaust process may include a purge process, a decompression process, or a combination thereof.

In some embodiments, after the step S20 of supplying the deposition precursor 2001, the step S30 may be performed to supply the reaction gas. In other embodiments, the step S30 of supplying the reaction gas may be performed simultaneously with the step S20 of supplying the deposition precursor 2001. In this case, it may be possible to omit the first exhaust process (e.g., a purge process).

A single cycle may be constituted by the step S20 of supplying the deposition precursor 2001, the step S21 of performing the first exhaust process, the step S30 of supplying the reaction gas, and the step S31 of performing the second exhaust process. The formation process of the thin layer 2000 may be performed several times. For example, the cycle for forming the thin layer 2000 may be repeatedly performed. In this case, the thin layer 2000 may include a plurality of stacked thin layers. Accordingly, a total thickness of the thin layers 2000 may be controlled.

In some embodiments, the thin layer 2000 may be used as electrodes of memory devices, resistance layers, diamagnetic layers of hard disks, or catalysts of polymer electrolyte membrane fuel cells. The thin layer 2000 is not limited thereto, but may be used as elements of various devices.

The following will discuss fabrication of metal compounds and formation of thin layers using the same with reference to experimental and comparative examples.

An inductively coupled plasma atomic emission spectrometer (ICP-AES) was used for element analysis in the following experimental and comparative examples.

In the following experimental and comparative examples, benzene substituted with deuterium was used as a solvent for nuclear magnetic resonance spectroscopy. Results of nuclear magnetic resonance spectroscopy are expressed by chemical shift (the number of H, multiplicity).

In the following experimental and comparative examples, a thermogravimetry-differential thermal analysis (TG-DTA) apparatus was used to perform a thermal analysis. In such cases, an argon gas was supplied at 100 mL/min. A temperature rise rate was 10° C./min. A differential thermal analysis was performed at a pressure of 760 Torr. When the mass of a sample supplied to an apparatus was reduced to 50 wt % of the initially supplied mass of the sample, a temperature (referred to hereinafter as a 50 wt % reduction temperature) was measured.

In the following experimental and comparative examples, results of element analysis are expressed by measured values. In addition, theoretical values are calculated and represented together with the measured values.

1. Fabrication of Metal Compound

<Experimental Example 1> Fabrication of Metal Compound Represented by No. 4

Under an argon environment, $NbF_5$ of 20.0 g (0.106 mol) and dehydrated hexane of 300 ml were added to a beaker of 500 mL. At room temperature (e.g., 25° C.), a mixed solution was formed by adding isovaleronitrile of 44.2 g (0.532 mol) to the beaker. The mixed solution was stirred for 5 hours at 50° C. Afterwards, under decompression at 50° C., a solvent was removed from the mixed solution. $NbF_5$ and isovaleronitrile left after the reaction were removed from the beaker whose temperature was raised to 90° C., which resulted in a preliminary product. The preliminary product was an orange-colored solid. Under a pressure of 30 Pa at a temperature of 120° C., the preliminary product was distilled to obtain a final product, or the metal compound represented by No. 4. The metal compound of No. 4 was a white solid.

Yield

The obtained final product (the metal compound of No. 4) had a mass of 11.2 g. The yield was calculated to 38.9%.

Thermal Analysis_TG-DTA

The 50 wt % reduction temperature was measured to 205° C.

Nuclear Magnetic Resonance (1H-NMR) Analysis 0.84 ppm (1H, multiplet), 0.74 ppm (2H, doublet), 0.22 ppm (6H, doublet)

Element Analysis

Nb: measured value; 34.5% (theoretical value; 34.3%)
C: measured value; 22.5% (theoretical value; 22.2%)
H: measured value; 2.9% (theoretical value; 3.3%)
N: measured value; 4.9% (theoretical value; 5.2%)
F: measured value; 35.2% (theoretical value; 35.0%)

<Experimental Example 2> Fabrication of Metal Compound Represented by No. 5

Under an argon environment, $NbF_5$ of 20.0 g (0.106 mol) and dehydrated hexane of 300 ml were added to a beaker of 500 mL. At room temperature (e.g., 25° C.), a mixed solution was formed by adding 2-methylbutanenitrile of 44.2 g (0.532 mol) to the beaker. The mixed solution was stirred for 5 hours at 50° C. Afterwards, under decompression at 50° C., a solvent was removed from the mixed solution. $NbF_5$ and 2-methylbutanenitrile left after the reaction were removed from the beaker whose temperature was raised to 90° C., which resulted in a preliminary product. The preliminary product is an orange-colored liquid. Under a pressure of 30 Pa at a temperature of 110° C., the preliminary product was distilled to obtain a final product, or the metal compound represented by No. 5. The metal compound of No. 5 was a colorless transparent liquid compound.

Yield

The obtained final product (the metal compound of No. 5) had a mass of 14.5 g. The yield was calculated to 50.4%.

Thermal Analysis_TG-DTA

The 50 wt % reduction temperature was measured to 200° C.

Nuclear Magnetic Resonance (1H-NMR) Analysis 1.22 ppm (1H, multiplet), 0.50 ppm (2H, doublet), 0.30 ppm (3H, doublet), 0.19 ppm (3H, triplet)

Element Analysis

Nb: measured value; 34.4% (theoretical value; 34.3%)
C: measured value; 22.6% (theoretical value; 22.2%)
H: measured value; 3.1% (theoretical value; 3.3%)
N: measured value; 5.0% (theoretical value; 5.2%)
F: measured value; 34.9% (theoretical value; 35.0%)

<Experimental Example 3> Fabrication of Metal Compound Represented by No. 9

Under an argon environment, $NbF_5$ of 20.0 g (0.106 mol) and dehydrated hexane of 300 ml were added to a beaker of 500 mL. At room temperature (e.g., 25° C.), a mixed solution was formed by adding n-octane nitrile of 66.6 g (0.532 mol) to the beaker. The mixed solution was stirred for 5 hours at 50° C. Afterwards, under decompression at 50° C., a solvent was removed from the mixed solution. $NbF_5$ and n-octane nitrile left after the reaction were removed from the beaker whose temperature was raised to 120° C., which resulted in a preliminary product. The preliminary product is an orange-colored liquid. Under a pressure of 30 Pa at a temperature of 150° C., the preliminary product was distilled to obtain a final product, or the metal compound represented by No. 9. The metal compound of No. 9 was a white solid.

Yield

The obtained final product (the metal compound of No. 9) had a mass of 13.6 g. The yield was calculated to 41.1%.

Thermal Analysis_TG-DTA

The 50 wt % reduction temperature was measured to 230° C.

Nuclear Magnetic Resonance (1H-NMR) Analysis 1.12 ppm (2H, multiplet), 0.92 ppm (2H, multiplet), 0.83 ppm (3H, triplet), 0.78 ppm (2H, multiplet), 0.71 ppm (2H, multiplet), 0.55 ppm (2H, multiplet), 0.44 ppm (2H, multiplet)

Element Analysis

Nb: measured value; 29.8% (theoretical value; 29.7%)
C: measured value; 30.9% (theoretical value; 30.7%)
H: measured value; 4.5% (theoretical value; 4.8%)
N: measured value; 4.4% (theoretical value; 4.5%)
F: measured value; 30.4% (theoretical value; 30.3%)

<Experimental Example 4> Fabrication of Metal Compound Represented by No. 11

Under an argon environment, $NbF_5$ of 20.0 g (0.106 mol) and dehydrated hexane of 300 ml were added to a beaker of 500 mL. At room temperature (e.g., 25° C.), a mixed solution was formed by adding n-decane nitrile of 81.5 g (0.532 mol) to the beaker. The mixed solution was stirred for 5 hours at 50° C. Afterwards, under decompression at 50° C., a solvent was removed from the mixed solution. $NbF_5$ and n-decane nitrile left after the reaction were removed from the beaker whose temperature was raised to 120° C., which resulted in a preliminary product. The preliminary product is an orange-colored liquid. Under a pressure of 30 Pa at a temperature of 160° C., to preliminary product was distilled to obtain a final product, or the metal compound represented by No. 11. The metal compound of No. 11 was a white solid.

Yield

The obtained final product (the metal compound of No. 11) had a mass of 13.9 g. The yield was calculated to 38.5%.

Thermal Analysis_TG-DTA

The 50 wt % reduction temperature was measured to 235° C.

Nuclear Magnetic Resonance (1H-NMR) Analysis 1.29 ppm (2H, multiplet), 1.21 ppm (2H, multiplet), 1.19 ppm (2H, multiplet), 0.97 ppm (2H, multiplet), 0.93 ppm (3H, triplet), 0.77 ppm (2H, multiplet), 0.72 ppm (2H, multiplet), 0.57 ppm (2H, multiplet), 0.45 ppm (2H, multiplet)

Element Analysis

Nb: measured value; 27.3% (theoretical value; 27.2%)
C: measured value; 35.4% (theoretical value; 35.2%)
H: measured value; 5.3% (theoretical value; 5.6%)
N: measured value; 4.0% (theoretical value; 4.1%)
F: measured value; 28.0% (theoretical value; 27.9%)

<Experimental Example 5> Fabrication of Metal Compound Represented by No. 45

Under an argon environment, $NbCl_5$ (V) of 20.0 g (0.074 mol) and hydrated toluene of 300 ml were added to a 4-neck flask of 500 mL. At room temperature (e.g., 25° C.), a mixed solution was formed by adding n-octanenitrile of 9.27 g (0.074 mol) to the beaker. The mixed solution was stirred for 5 hours in a bath. The bath was maintained at a temperature of 50° C. Under a temperature of 50° C., the mixed solution experienced a decompression process to remove a solvent from the mixed solution. Therefore, a preliminary product was obtained. Under a pressure of 30 Pa at a temperature of 180° C., the preliminary product was distilled to obtain a final product, or the metal compound represented by No. 45. The final product was a yellow solid.

Yield

The obtained final product (the metal compound of No. 45) had a mass of 21.9 g. The yield was calculated to 75.0%.

Thermal Analysis_TG-DTA

The 50 wt % reduction temperature was measured to 244° C.

Nuclear Magnetic Resonance (1H-NMR) Analysis 2.79 ppm (2H, triplet), 1.88 ppm (2H, quintet), 1.55 ppm (2H, quintet), 1.36 ppm (6H, multiplet), 0.90 ppm (3H, triplet)

Element Analysis

Nb: measured value; 23.7% (theoretical value; 23.5%)
C: measured value; 24.9% (theoretical value; 24.3%)
H: measured value; 4.1% (theoretical value; 3.8%)
N: measured value; 3.6% (theoretical value; 3.5%)
Cl: measured value; 44.5% (theoretical value; 44.8%)

<Experimental Example 6> Fabrication of Metal Compound Represented by No. 41

Under an argon environment, $NbCl_5$ (V) of 20.0 g (0.074 mol) and hydrated toluene of 300 ml were added to a 4-neck flask of 500 mL. At room temperature (e.g., 25° C.), a mixed solution was formed by adding n-butyl cyanide of 6.16 g (0.074 mol) to the beaker. The mixed solution was stirred for 5 hours in a bath. The bath was maintained at a temperature of 50° C. Under a temperature of 50° C., the mixed solution experienced a decompression process to remove a solvent from the mixed solution. Therefore, a preliminary product was obtained. Under a pressure of 30 Pa at a temperature of 150° C., the preliminary product was distilled to obtain a final product, or the metal compound represented by No. 41. The final product was a yellow solid.

Yield

The obtained final product (the metal compound of No. 41) had a mass of 20.8 g. The yield was calculated to 79.5%.

Thermal Analysis_TG-DTA

The 50 wt % reduction temperature was measured to 223° C.

Nuclear Magnetic Resonance (1H-NMR) Analysis 1.27 ppm (1H, sextet), 0.64 ppm (2H, multiplet), 0.44 ppm (3H, triplet), 0.25 ppm (3H, doublet)

Element Analysis

Nb: measured value; 26.9% (theoretical value; 26.3%)
C: measured value; 17.6% (theoretical value; 17.0%)
H: measured value; 2.8% (theoretical value; 2.6%)
N: measured value; 4.0% (theoretical value; 4.1%)
Cl: measured value; 50.8% (theoretical value; 50.2%)

Comparative Example 1

A metal compound represented by Chemical Formula 3A was prepared as a comparative example.

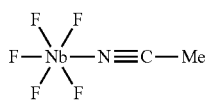

[Chemical Formula 3A]

In Chemical Formula 3A, Me is a methyl group.

Comparative Example 2

A metal compound represented by Chemical Formula 3B was prepared as a comparative example.

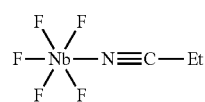

[Chemical Formula 3B]

In Chemical Formula 3B, Et is an ethyl group.

2. Formation of Thin Layer

An atomic deposition apparatus was employed to form a thin layer. The formation of the thin layer included performing a cycle including the following process 1, process 2, process 3, and process 4, and repeatedly performing the cycle 150 times. In this case, a substrate was at a temperature of 250° C. An ammonia gas was used as a reaction gas.

Process 1: a precursor supply unit was heated to 90° C. and was adjusted to a pressure of 100 Pa, which resulted in evaporation of a deposition precursor. A deposition precursor vapor was supplied to a chamber for 30 seconds. A pressure of 100 Pa was given to supply the deposition precursor vapor.

Process 2: an argon gas was supplied to purge the chamber for 10 seconds.

Process 3: the chamber was supplied with a reaction gas for 30 seconds under a pressure of 100 Pa.

Process 4: an argon gas was supplied to purge the chamber for 10 seconds.

Each metal compound of Experimental Examples 1, 2, 3, and 4 and Comparative Examples 1 and 2 was used as the deposition precursor for the formation of the thin layer.

3. Evaluation of Thin Layer

X-ray reflectivity was used to measure a thickness of the thin layer.

X-ray diffraction was used to ascertain the presence of a compound in the thin layer.

X-ray photoelectron spectroscopy was used to measure an amount of carbon contained in the thin layer.

Table 1 lists thermal analysis results of the metal compounds fabricated by Experimental Examples 1 to 4. When the mass of a sample supplied to the thermogravimetry-differential thermal analysis (TG-DTA) apparatus was reduced to 50 wt % of the initially supplied mass of the sample, a temperature (referred to hereinafter as TG50) was measured.

TABLE 1

|  |  | TG50 (° C.) |
| --- | --- | --- |
| Experimental Example 1 | Metal Compound of No. 4 | 205 |
| Experimental Example 2 | Metal Compound of No. 5 | 200 |
| Experimental Example 3 | Metal Compound of No. 9 | 230 |
| Experimental Example 4 | Metal Compound of No. 11 | 235 |

Referring to Table 1, it was observed that the TG50 of Experimental Examples 1 to 4 was 250° C. or less, for example, 100° C. to 250° C. The lower TG50, the higher the vapor pressure for a compound. It may be ascertained that the metal compounds of Experimental Examples 1 to 4 have high vapor pressures. In particular, it was observed that each of the metal compounds of Experimental Examples 1 and 2 had a low TG50. From these results, it may be found that the metal compounds of Experimental Examples 1 and 2 have extremely high vapor pressures.

Table 2 shows melting points measured in Experimental Examples 1 to 4 and Comparative Examples 1 and 2.

TABLE 2

|  | Melting Point (° C.) |
| --- | --- |
| Experimental Example 1 | 30 |
| Experimental Example 2 | 15 |
| Experimental Example 3 | 45 |
| Experimental Example 4 | 55 |
| Comparative Example 1 | 180 |
| Comparative Example 2 | 130 |

Referring to Table 2, the metal compounds of Experimental Examples 1 to 4 have melting points lower than those of the metal compounds of Comparative Examples 1 and 2. In particular, the metal compound of Experimental Example 2 has an extremely low melting point. Each of the metal compounds of Comparative Examples 1 and 2 has a melting point of 130° C. or higher. When the metal compound of Comparative Example 1 or 2 is used a deposition precursor, it may be hard to transfer the deposition precursor. The metal compounds of Experimental Examples 1 to 4 may have relatively low melting points (e.g., 60° C. or lower). A deposition precursor may be transferred in a liquid state. The lower melting point of the deposition precursor, the easier it may be to transfer the deposition precursor. Therefore, when the metal compounds of Experimental Examples 1 to 4 are used as deposition precursors, it may be easy to transfer the deposition precursors, particularly when compared to Comparative Examples 1 and 2.

Table 3 lists thicknesses and carbon amounts for thin layers deposited using a metal compound of Experimental Examples 1 to 4 or Comparative Examples 1 and 2. For such thin layers, 0.1 atomic mass % was given as the minimum detection limit for the amount of carbon in a thin layer.

TABLE 3

|  | Thickness of thin layer (nm) | Carbon amount in thin layer |
| --- | --- | --- |
| Experimental Example 1 | 8 | Not detected |
| Experimental Example 2 | 10 | Not detected |
| Experimental Example 3 | 6 | Not detected |
| Experimental Example 4 | 6 | Not detected |
| Comparative Example 1 | 2 | 6 atomic mass % |
| Comparative Example 2 | 3 | 4 atomic mass % |

Referring to Table 3, although the thin layers of Experimental Examples 1 to 4 have a thickness greater than the thickness of the thin layers of Comparative Examples 1 and 2, the thin layers of Experimental Examples 1 to 4 have carbon amounts less than those of the thin layers of Comparative Examples 1 and 2. No carbon was detected in the thin layers of Experimental Examples 1 to 4. In particular, while the thin layer of Experimental Example 2 had a thickness of 10 nm, no carbon was detected in the thin layer of Experimental Example 2. It may be found that no or an extremely small amount of impurities are included in the thin layers of Experimental Examples 1 to 4.

FIGS. 4A to 4G illustrate cross-sectional views showing a method of fabricating a semiconductor device according to some example embodiments of the present inventive concepts. A duplicate description will be omitted below.

Figure 4A:
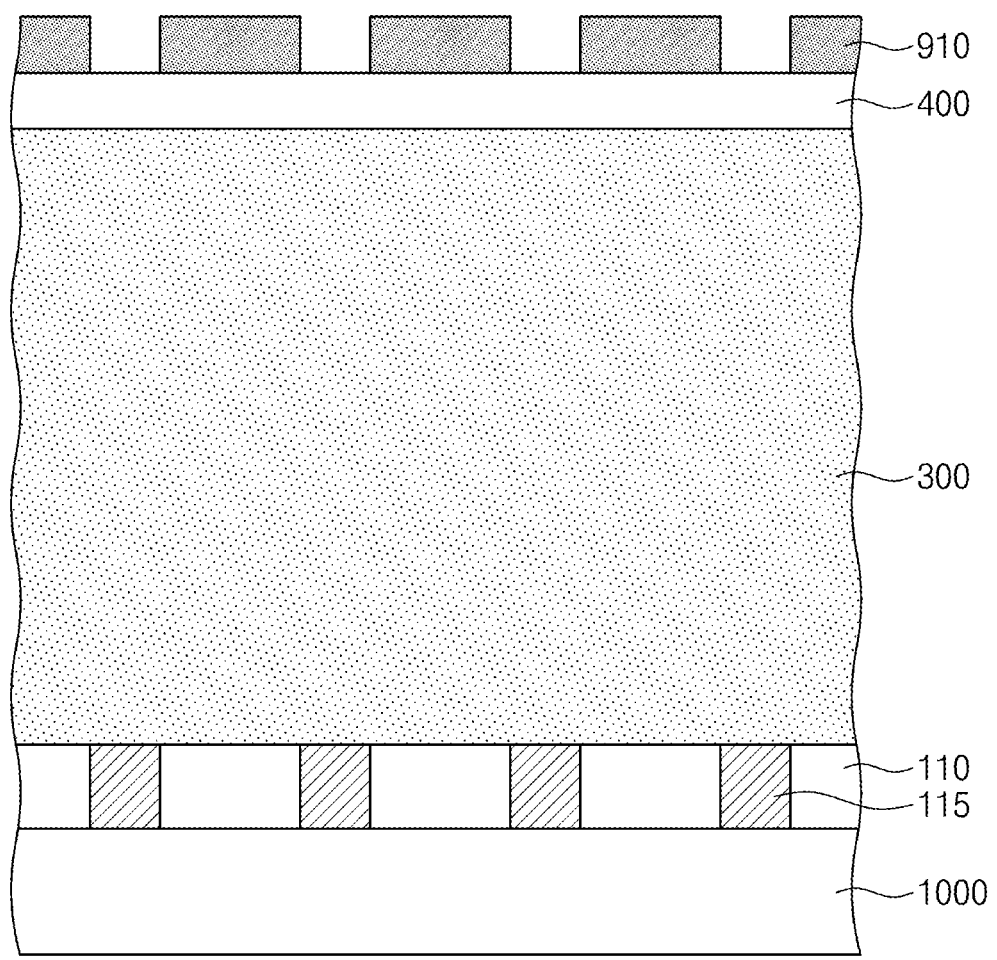
FIGS. 4A to 4G illustrate cross-sectional views showing a method of fabricating a semiconductor device according to some example embodiments.

Referring to FIG. 4A, an interlayer dielectric layer 110 may be formed on a top surface of a substrate 1000. The substrate 1000 may be substantially the same as that discussed above in FIGS. 3A and 3B. For example, the substrate 1000 may be a semiconductor substrate. The interlayer dielectric layer 110 may include one or more of a silicon oxide layer, a silicon nitride layer, and a silicon oxynitride layer.

Contact plugs 115 may be formed in the interlayer dielectric layer 110. The interlayer dielectric layer 110 may expose top surfaces of the contact plugs 115. The contact plugs 115 may include one or more of a semiconductor material (e.g., polycrystalline silicon), a metal-semiconductor compound (e.g., tungsten silicide), a conductive metal nitride layer (e.g., titanium nitride, tantalum nitride, or tungsten nitride), and a metallic material (e.g., titanium, tungsten, or tantalum). Although not shown, a plurality of word lines and a plurality of bit lines may be formed on and/or in the substrate 1000. The word lines may intersect the bit lines. The interlayer dielectric layer 110 may be formed to cover the word lines and the bit lines. Impurity regions (not shown) may be formed in the substrate 1000 on opposite sides of each of the word lines, and each of the contact plugs 115 may be connected to one of the impurity regions.

A mold layer 300 may be formed on the interlayer dielectric layer 110 and the contact plugs 115. The mold layer 300 may include a dielectric semiconductor material, such as a silicon nitride layer.

A support layer 400 may be formed on the mold layer 300. The support layer 400 may include a material having an etch selectivity with respect to the mold layer 300. The support layer 400 may include, for example, silicon oxide.

A first mask layer 910 may be formed to cover the support layer 400. The first mask layer 910 may include, for example, one or more of a polysilicon layer, a silicon nitride layer, a silicon oxynitride layer, a spin-on-hardmask (SOH) layer, and an amorphous carbon layer (ACL).

Figure 4B:
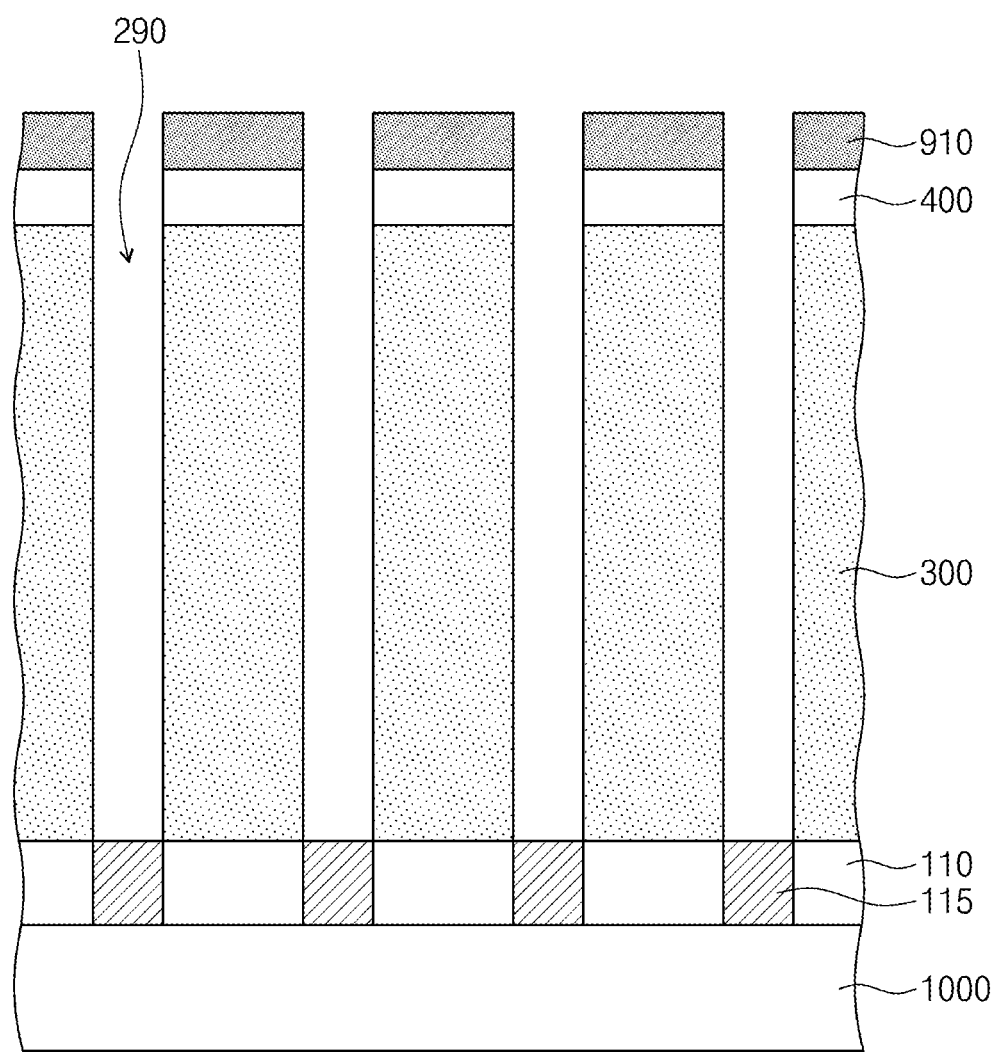

Referring to FIG. 4B, an electrode hole 290 may be formed in the support layer 400 and the mold layer 300, thereby exposing the contact plugs 115. The formation of the electrode hole 290 may include using the first mask layer 910 as an etching mask to etch the support layer 400 and the mold layer 300. The electrode hole 290 may expose the top surface of the contact plugs 115, an inner sidewall of the support layer 400, and an inner sidewall of the mold layer 300.

Figure 4C:
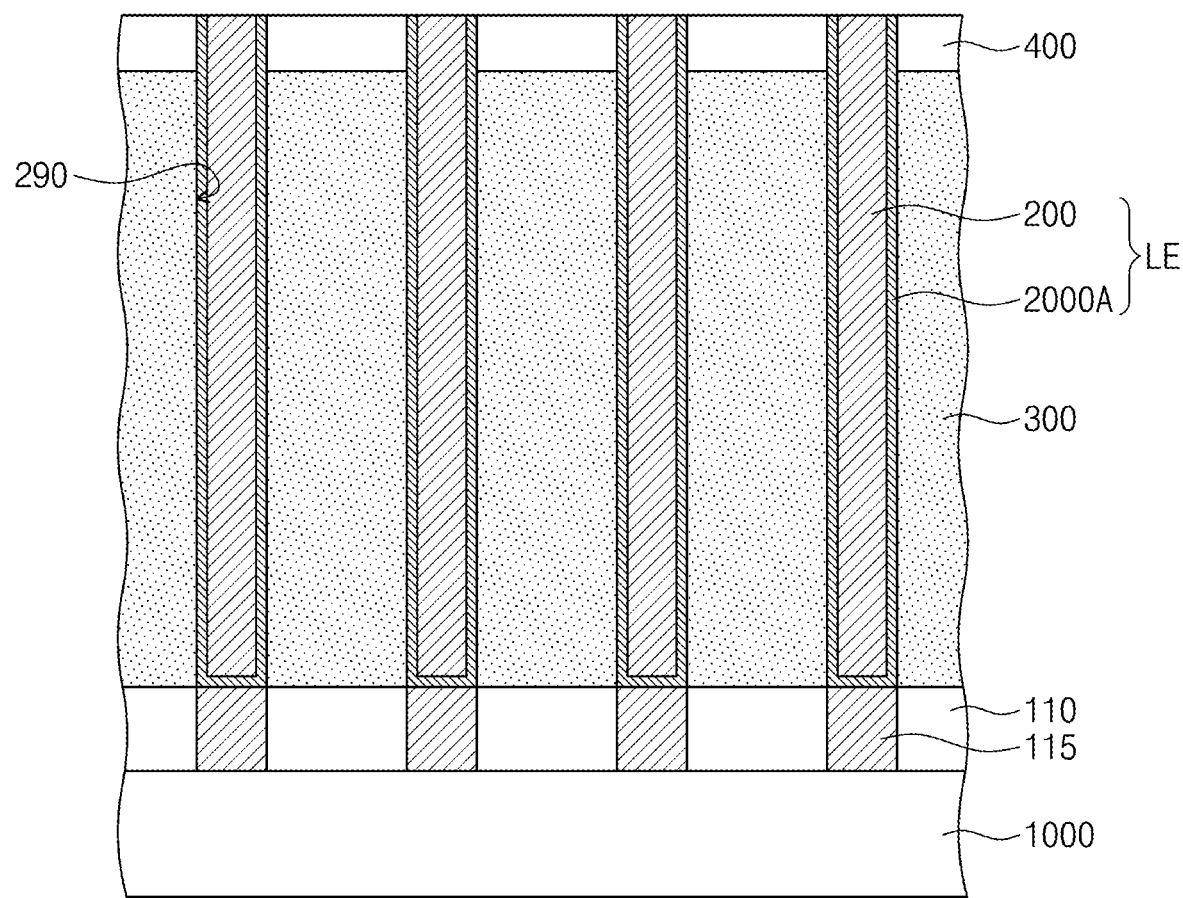

Referring to FIG. 4C, a lower electrode pattern 2000A and a lower electrode pillar 200 may be formed in the electrode hole 290, thereby forming a lower electrode structure LE. The lower electrode structure LE may include the lower electrode pattern 2000A and the lower electrode pillar 200. The formation of the lower electrode pattern 2000A and the lower electrode pillar 200 may include forming a lower electrode layer on a bottom surface and a sidewall of the electrode hole 290 and on a top surface of the support layer 400, forming on the lower electrode layer a preliminary lower electrode pillar to fill the electrode hole 290, and planarizing the lower electrode layer and the preliminary lower electrode pillar. The planarization process may continue until the support layer 400 is exposed. The lower electrode layer and the preliminary lower electrode pillar may be planarized to form the lower electrode pattern 2000A and the lower electrode pillar 200, respectively. The lower electrode pattern 2000A and the lower electrode pillar 200 may be localized in the electrode hole 290.

The lower electrode layer may be formed by a thin-layer formation method discussed above in FIGS. 1, 2, 3A, and 3B. For example, the lower electrode layer may be formed by a deposition process that uses a deposition precursor including a metal compound according to some example embodiments of the present inventive concepts. The deposition process may be an atomic layer deposition (ALD) process. In this case, a nitrogen-containing compound may be used as a reaction gas. Therefore, the lower electrode pattern 2000A may include a niobium-containing nitride layer (e.g., NbNx), a niobium-containing oxide layer (e.g., NbOx), or a niobium-containing oxynitride layer (e.g., NbOxNy) (where, x and y are positive real numbers independently of each other). The lower electrode pattern 2000A may include no carbon. The lower electrode pattern 2000A may include no halogen elements. Carbon and halogen elements may serve as impurities in the lower electrode pattern 2000A. Therefore, the lower electrode pattern 2000A may have low resistivity. The lower electrode structure LE may have high conductance. Because the metal compound according to some embodiments has a low melting point and a high vapor pressure, the lower electrode pattern 2000A may be easily fabricated.

The lower electrode pillar 200 may have a columnar shape. In some embodiments, the lower electrode pillar 200 may have a cylindrical shape. The lower electrode pillar 200 may include one or more of a metallic material (e.g., cobalt, titanium, nickel, tungsten, and/or molybdenum), a metal nitride layer (e.g., a titanium nitride (TiN) layer, a titanium silicon (TiSiN) layer, a titanium aluminum nitride (TiAlN) layer, a tantalum nitride (TaN) layer, a tantalum aluminum nitride layer (TaAlN), and/or a tungsten nitride (WN) layer), a noble metal layer (e.g., platinum (Pt), ruthenium (Ru), and/or iridium (Ir)), a conductive oxide layer (e.g., PtO, RuO$_2$, IrO$_2$, SRO(SrRuO$_3$), BSRO((Ba,Sr)RuO$_3$), CRO (CaRuO$_3$), and/or LSCo), and/or a metal silicide layer.

The first mask layer 910 may be removed. The removal of the first mask layer 910 may be performed during and/or after the formation of the lower electrode structure LE.

Figure 4D:
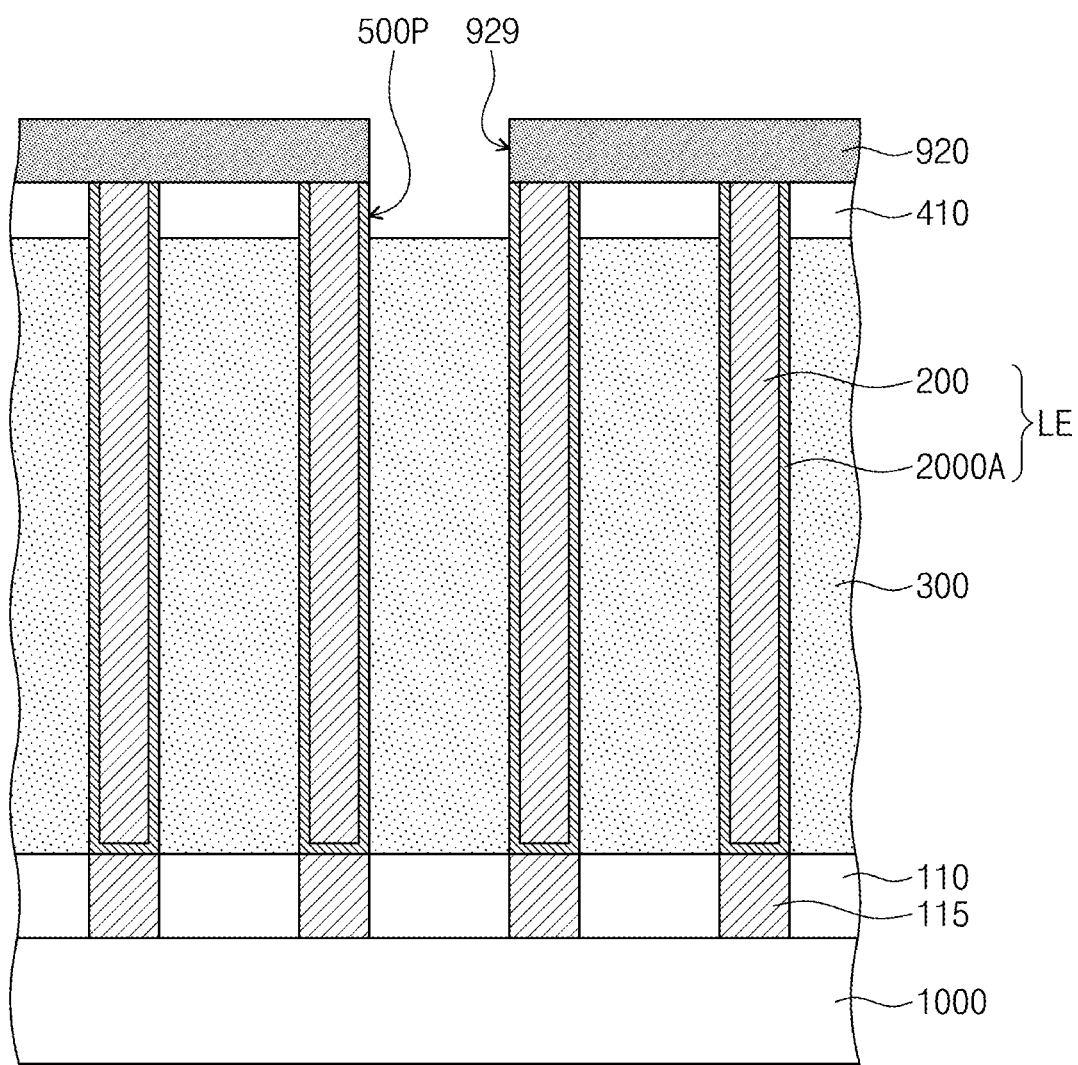

Referring sequentially to FIGS. 4C and 4D, a second mask layer 920 may be formed on the lower electrode pillars 200 and the support layer 400. The second mask layer 920 may have an opening 929, and the opening 929 may expose a portion of the support layer 400. The second mask layer 920 may include a material having an etch selectivity with respect to the support layer 400.

The support layer 400 exposed by the second mask layer 920 may be removed to form a support pattern 410 and a preliminary through hole 500P. In some embodiments, the formation of the support pattern 410 may include using the second mask layer 920 as an etching mask to etch the exposed support layer 400. The etching of the support layer 400 may be performed by an anisotropic etching process that continues until the mold layer 300 is exposed. Therefore, the support pattern 410 and the preliminary through hole 500P may be formed. The preliminary through hole 500P may be spatially connected to the opening 929. The preliminary through hole 500P may expose a top surface of the mold layer 300 and a sidewall of the lower electrode structure LE. For example, the preliminary through hole 500P may expose a top outer sidewall of the lower electrode pattern 2000A.

Figure 4E:
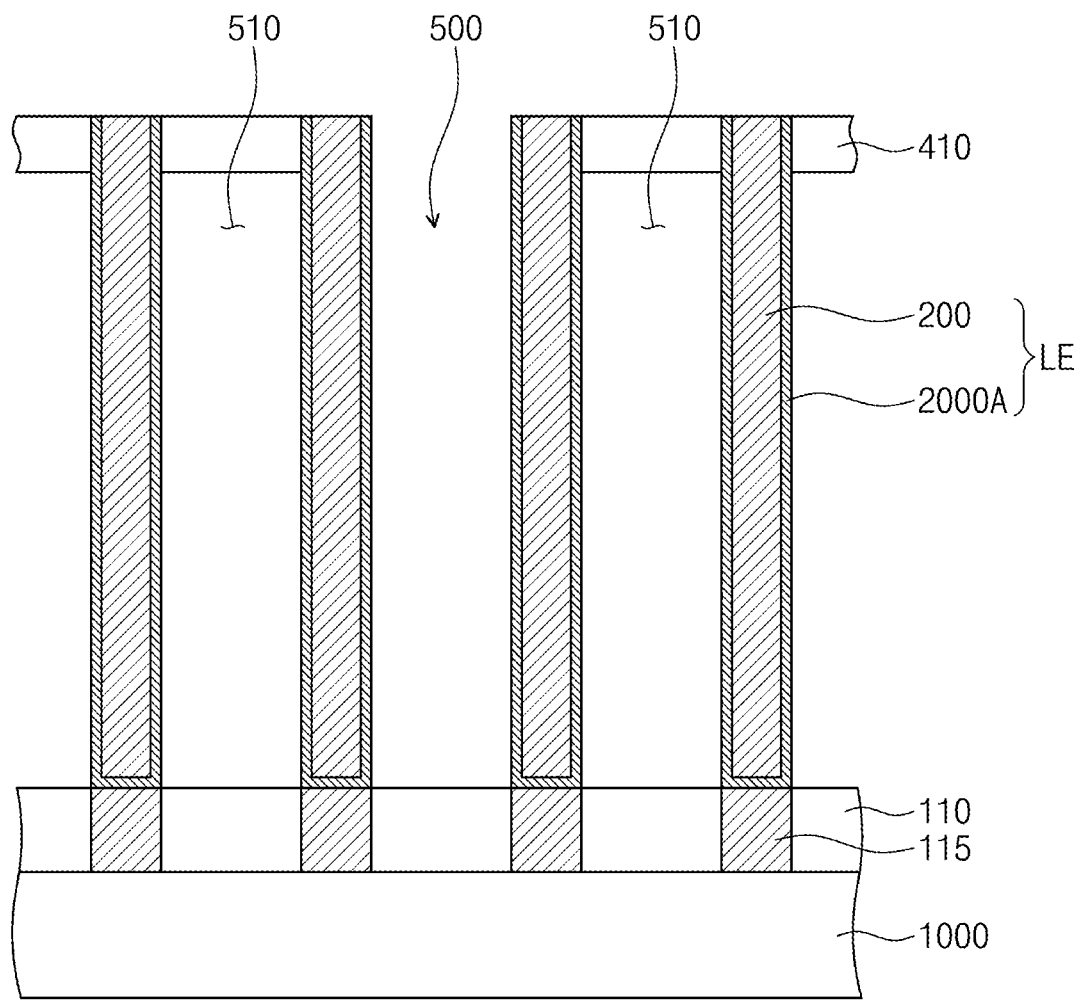

Referring to FIG. 4E, the mold layer 300 may be removed to form a through hole 500 and an empty space 510. The removal of the mold layer 300 may include performing an isotropic etching process on the mold layer 300 exposed to the preliminary through hole 500P. The isotropic etching process may be performed by using, for example, a phosphoric acid as an etchant. When the mold layer 300 is etched, the support pattern 410 may have an etch selectivity and thus may not be removed.

The lower electrode structure LE may include a plurality of lower electrode structures. As a result of removing the mold layer 300, the preliminary through hole 500P may extend to form the through hole 500. The through hole 500 may be formed between two lower electrode structures LE adjacent to each other. The through hole 500 may expose a top surface of a first part of the interlayer dielectric layer 110 and outer sidewalls of two lower electrode patterns 2000A. The first part of the interlayer dielectric layer 110 may not vertically overlap the support pattern 410. The two lower electrode structures LE may be adjacent to the first part of the interlayer dielectric layer 110. For example, the lower electrode structures LE may include a first sub-lower electrode structure, a second sub-lower electrode structure, and a third sub-lower electrode structure. The second sub-lower electrode structure may be adjacent to and interposed between the first sub-lower electrode structure and the third sub-lower electrode structure. The two lower electrode patterns 2000A may be the first sub-lower electrode structure and the second sub-lower electrode structure.

The empty space 510 may be formed between the interlayer dielectric layer 110 and the support pattern 410. The empty space 510 may be formed between sidewalls of two adjacent lower electrode structures LE. For example, the empty space 510 may be formed between the second sub-lower electrode structure and the third sub-lower electrode structure. The empty space 510 may expose a top surface of a second part of the interlayer dielectric layer 110, a bottom surface of the support pattern 410, and sidewalls of the two lower electrode structures LE. The second part of the interlayer dielectric layer 110 may vertically overlap the support pattern 410. As used herein in this description, the term "vertically" may mean parallel to a direction perpendicular to the top surface of the substrate 1000.

The second mask layer 920 may be removed to expose a top surface of the support pattern 410. A single etching process may be performed to remove the second mask layer 920 together with the mold layer 300. Alternatively, the second mask layer 920 and the mold layer 300 may be removed by separate processes from each other.

Figure 4F:
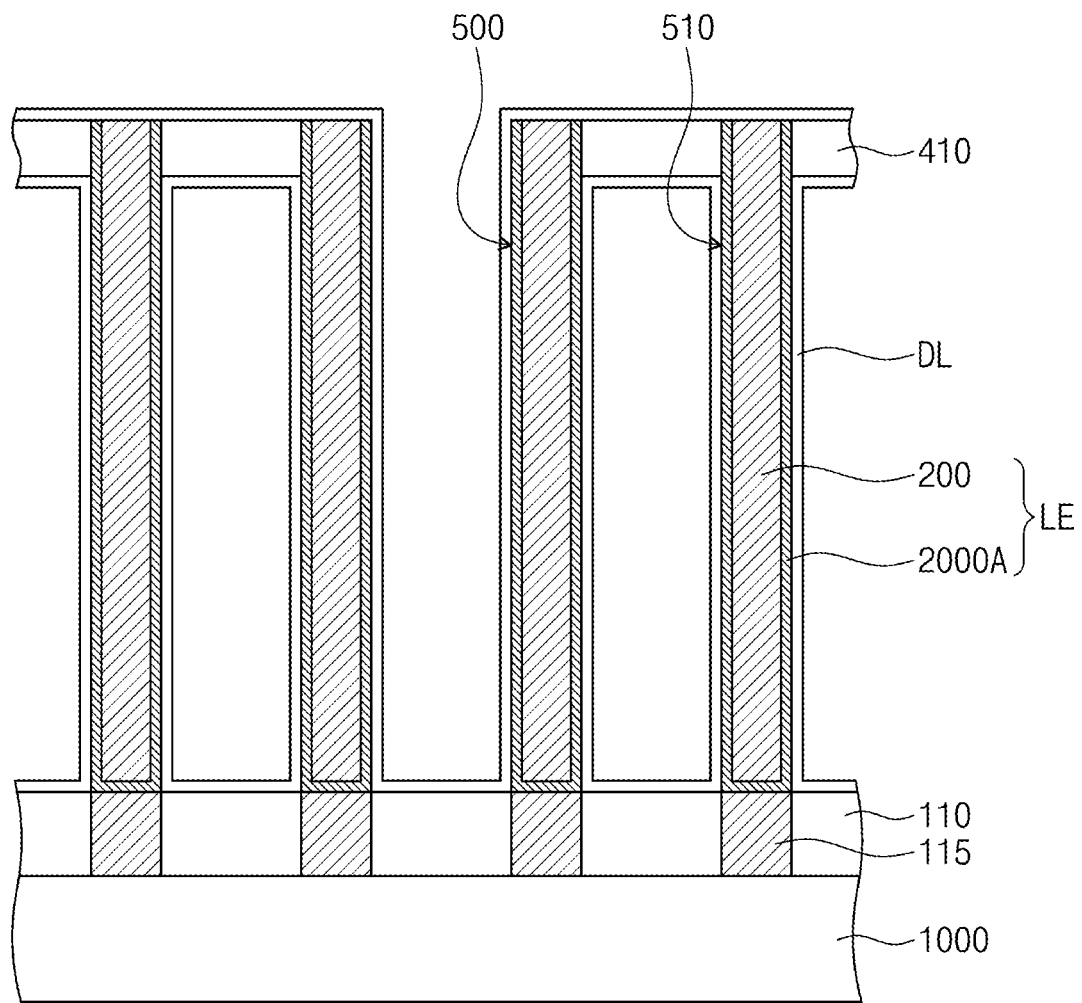

Referring to FIG. 4F, a dielectric layer DL may be formed in the through hole 500 and the empty space 510. The dielectric layer DL may conformally cover a top surface of the interlayer dielectric layer 110, a top surface and sidewalls of the lower electrode structure LE, and top and bottom surfaces of the support pattern 410. The sidewalls of the lower electrode structure LE may correspond to outer walls of the lower electrode pattern 2000A. The top surface of the lower electrode structure LE may include a top surface of the lower electrode pattern 2000A and a top surface of the lower electrode pillar 200.

The lower electrode pattern 2000A may serve as a seed layer to crystallize the dielectric layer DL. The dielectric layer DL may physically contact the lower electrode pattern 2000A and may have the same crystal structure as that of the lower electrode pattern 2000A. The dielectric layer DL may have, for example, a tetragonal structure. As a result, a semiconductor device may increase in electrical characteristics. The dielectric layer DL may be formed by using a layer-formation technique, such as chemical vapor deposition (CVD) or atomic layer deposition (ALD), and/or may have superior step coverage properties.

The dielectric layer DL may be a single layer or a multiple layer. The dielectric layer DL may include a metal oxide, perovskite-structured dielectric, or a combination thereof. The metal oxide may include, for example, one or more of HfO$_2$, ZrO$_2$, Al$_2$O$_3$, La$_2$O$_3$, Ta$_2$O$_3$, and TiO$_2$. The perovskite-structured dielectric may include one or more of SrTiO$_3$(STO), (Ba,Sr)TiO$_3$(BST), BaTiO$_3$, PZT, and PLZT.

Figure 4G:
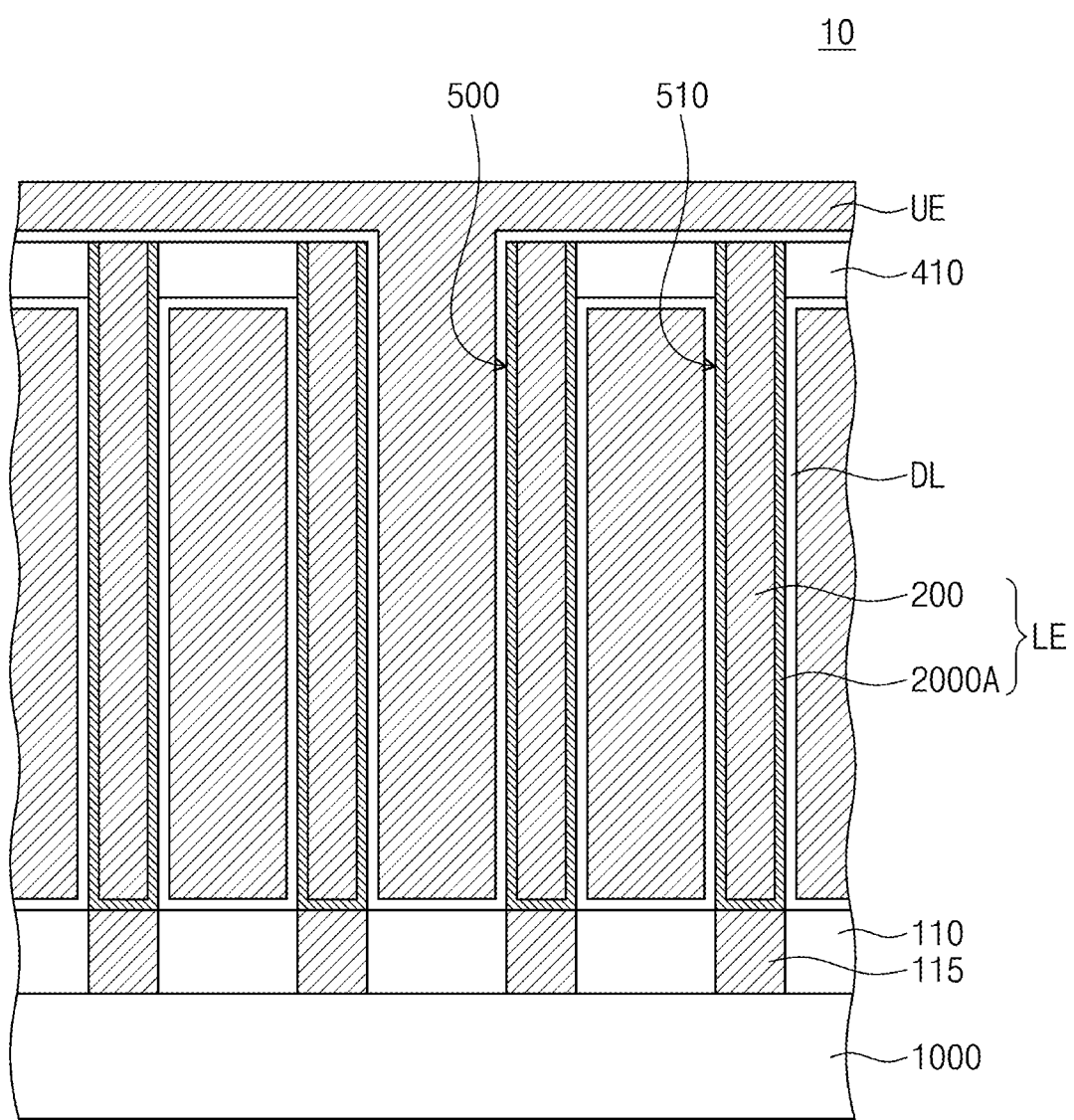

Referring to FIG. 4G, an upper electrode UE may be formed on the dielectric layer 110. The empty space 510 may be filled with the upper electrode UE on a top surface of the dielectric layer DL. The upper electrode UE may be formed of one or more of an impurity-doped semiconductor material, a metallic material, a metal nitride material, and/or a metal silicide material. The metal nitride material may include, for example, one or more of a titanium nitride (TiN) layer, a titanium aluminum nitride (TiAlN) layer, and/or a tungsten nitride (WN) layer. The metallic material may be one selected from platinum (Pt), ruthenium (Ru), and iridium (Ir). Alternatively, the upper electrode UE may be formed of a refractory metallic material, such as cobalt, titanium, nickel, tungsten, and molybdenum. A semiconductor device 100 may thus be fabricated.

According to the present inventive concepts, a metal compound of the present inventive concepts may have a low melting point, and may thus be easily transported. The metal compound may be used as a deposition precursor. The metal compound according to some embodiments may have a high vapor pressure and thus may be easily evaporated. When using a deposition precursor including the metal compound, a deposition process may be easily performed. In some embodiments, the metal compound may include no impurities or an extremely low-concentration of impurities. Accordingly, a deposited thin layer may exhibit excellent characteristics.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

That which is claimed is:

1. A metal compound comprising a material of Chemical Formula 1:

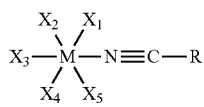
[Chemical Formula 1]

wherein:
M is Nb or Ta;
R is a substituted or unsubstituted C3 to C10 alkyl group; and
$X_1$, $X_2$, $X_3$, $X_4$, and $X_5$ are each independently selected from F, Cl, Br, and I, and
wherein when M is Nb, and R is an unsubstituted C4 alkyl group, then at least one of $X_1$, $X_2$, $X_3$, $X_4$, and $X_5$ is not Cl.

2. The metal compound of claim 1, wherein $X_1$, $X_2$, $X_3$, $X_4$, and $X_5$ are each independently F or Cl.

3. The metal compound of claim 1, wherein R is a substituted or unsubstituted C3 to C5 alkyl group.

4. The metal compound of claim 3, wherein R is a butyl group.

5. The metal compound of claim 4, wherein R is a sec-butyl group.

6. The metal compound of claim 1, wherein M is Nb.

7. The metal compound of claim 1, wherein $X_1$, $X_2$, $X_3$, $X_4$, and $X_5$ are each F.

8. The metal compound of claim 1, wherein the material of Chemical Formula 1 has a melting point in a range of −50° C. to 60° C.

9. The metal compound of claim 1, wherein R is an unsubstituted C3 to C10 alkyl group or a halogen-substituted C3 to C10 alkyl group.

10. A method of fabricating a semiconductor device, the method comprising:
providing a deposition precursor; and
forming a layer with the deposition precursor,
wherein the deposition precursor includes a metal compound comprising a material of Chemical Formula 1:

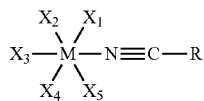
[Chemical Formula 1]

wherein:
M is Nb or Ta;
R is a substituted or unsubstituted C3 to C10 alkyl group; and
$X_1$, $X_2$, $X_3$, $X_4$, and $X_5$ are each independently selected from F, Cl, Br, and I.

11. The method of claim 10, wherein the deposition precursor has a melting point in a range of −50° C. to 60° C.

12. The method of claim 11, wherein providing the deposition precursor comprises providing the deposition precursor in a precursor storage unit; and the method further comprises transferring the deposition precursor from the precursor storage unit through a supply pipe to a precursor supply unit.

13. The method of claim 10, wherein the layer includes niobium (Nb) or tantalum (Ta), and the layer is devoid of carbon.

14. The method of claim 10, further comprising:
forming on the layer a plurality of lower electrode pillars to fabricate a lower electrode structure;
forming a dielectric layer on the lower electrode structure; and
forming an upper electrode on the dielectric layer.

15. The method of claim 10, wherein forming the layer with the deposition precursor comprises:
supplying a chamber including a substrate with the deposition precursor to form a precursor layer on the substrate; and
contacting a reaction gas to the precursor layer.

16. The method of claim 10, wherein $X_1$, $X_2$, $X_3$, $X_4$, and $X_5$ are each independently F or Cl.

17. The method of claim 10, wherein R is a substituted or unsubstituted C3 to C5 alkyl group.

18. The method of claim 10, wherein M is Nb, R is a butyl group, and $X_1$, $X_2$, $X_3$, $X_4$, and $X_5$ are each F.

19. The metal compound of claim 1, wherein when M is Nb, and each of $X_1$, $X_2$, $X_3$, $X_4$, and $X_5$ is Cl, then R is a substituted C3 to C10 alkyl group.

20. The metal compound of claim 1, wherein when M is Nb, and each of $X_1$, $X_2$, $X_3$, $X_4$, and $X_5$ is Cl, then R is a halogen-substituted C3 to C10 alkyl group.

* * * * *